(12) United States Patent
Murakami

(10) Patent No.: US 9,945,696 B2
(45) Date of Patent: Apr. 17, 2018

(54) STROKE SENSOR SYSTEM AND LC OSCILLATION CIRCUIT

(71) Applicant: Showa Corporation, Gyoda-shi (JP)

(72) Inventor: Yosuke Murakami, Fukuroi (JP)

(73) Assignee: SHOWA CORPORATION, Gyoda-Shi (JP)

( * ) Notice: Subject to any disclaimer, the term of this patent is extended or adjusted under 35 U.S.C. 154(b) by 148 days.

(21) Appl. No.: 14/837,375

(22) Filed: Aug. 27, 2015

(65) Prior Publication Data

US 2016/0265945 A1 Sep. 15, 2016

(30) Foreign Application Priority Data

Mar. 10, 2015 (JP) .................................. 2015-047718

(51) Int. Cl.
*G01D 5/24* (2006.01)
*G01D 5/20* (2006.01)
*H03B 5/08* (2006.01)

(52) U.S. Cl.
CPC .............. *G01D 5/24* (2013.01); *G01D 5/202* (2013.01); *H03B 5/08* (2013.01)

(58) Field of Classification Search
USPC .... 324/686, 207.16, 207.15, 207.13, 207.11, 324/200; 701/1, 117; 180/170; 152/416;
(Continued)

(56) References Cited

U.S. PATENT DOCUMENTS

| 3,891,918 A | 6/1975 | Ellis |
| 4,674,768 A | 6/1987 | Morra |

(Continued)

FOREIGN PATENT DOCUMENTS

| JP | 61-163011 A | 7/1986 |
| JP | 06-079098 A | 3/1994 |
| WO | WO-2013/066158 A | 5/2013 |

OTHER PUBLICATIONS

Alexander Russell, Inductive Displacement Transducers, GB2089515A, Jun. 23, 1982, Forrester Ketley & Co, G01B7/10.*
(Continued)

*Primary Examiner* — Melissa Koval
*Assistant Examiner* — Nasima Monsur
(74) *Attorney, Agent, or Firm* — Leason Ellis LLP

(57) ABSTRACT

A stroke sensor system includes a vehicle-body-side member, a wheel-side member, and a movement-amount deriving section. The movement-amount deriving section derives a movement amount of relative movement between the vehicle-body-side member and the wheel-side member. At least a part of one of the vehicle-body-side member and the wheel-side member is a conductor, and the other is provided with a coil. The movement-amount deriving section includes an even number of capacitors and an even number of exciting sections. The even number of capacitors are electrically coupled to the coil and configure an LC resonance section. The even number of exciting sections are for exciting an oscillation waveform output by the LC resonance section. The even number of capacitors and the even number of exciting sections are divided into equal numbers to configure a balanced circuit. The movement-amount deriving section derives the movement amount based on the oscillation waveform.

16 Claims, 17 Drawing Sheets

(58) Field of Classification Search
USPC .......................................... 318/128; 340/988
See application file for complete search history.

(56) References Cited

U.S. PATENT DOCUMENTS

| | | | |
|---|---|---|---|
| 4,696,489 A | | 9/1987 | Fujishiro et al. |
| 5,172,298 A | * | 12/1992 | Shimizu ............... G01D 5/2013 |
| | | | 324/207.16 |
| RE34,628 E | | 6/1994 | Fujishiro et al. |
| 5,619,133 A | | 4/1997 | Shank et al. |
| 2004/0080374 A1 | * | 4/2004 | Muramatsu .......... H03B 5/1228 |
| | | | 331/117 R |
| 2004/0085063 A1 | * | 5/2004 | Jin ........................ G01D 5/202 |
| | | | 324/207.16 |
| 2004/0169564 A1 | * | 9/2004 | Muramatsu .......... H03B 5/1265 |
| | | | 331/177 V |
| 2006/0097811 A1 | * | 5/2006 | Nakamura ............ H03B 5/1228 |
| | | | 331/167 |
| 2008/0238560 A1 | * | 10/2008 | Shibata ................ H03B 5/1228 |
| | | | 331/132 |
| 2009/0040795 A1 | * | 2/2009 | Park ........................ G06F 1/324 |
| | | | 363/21.15 |

OTHER PUBLICATIONS

Extended European Search Report dated Jul. 25, 2016 for the corresponding European Patent Application No. 15182841.5.
Office Action dated Dec. 5, 2017 for the corresponding Japanese Patent Application No. 2015-047718.

\* cited by examiner

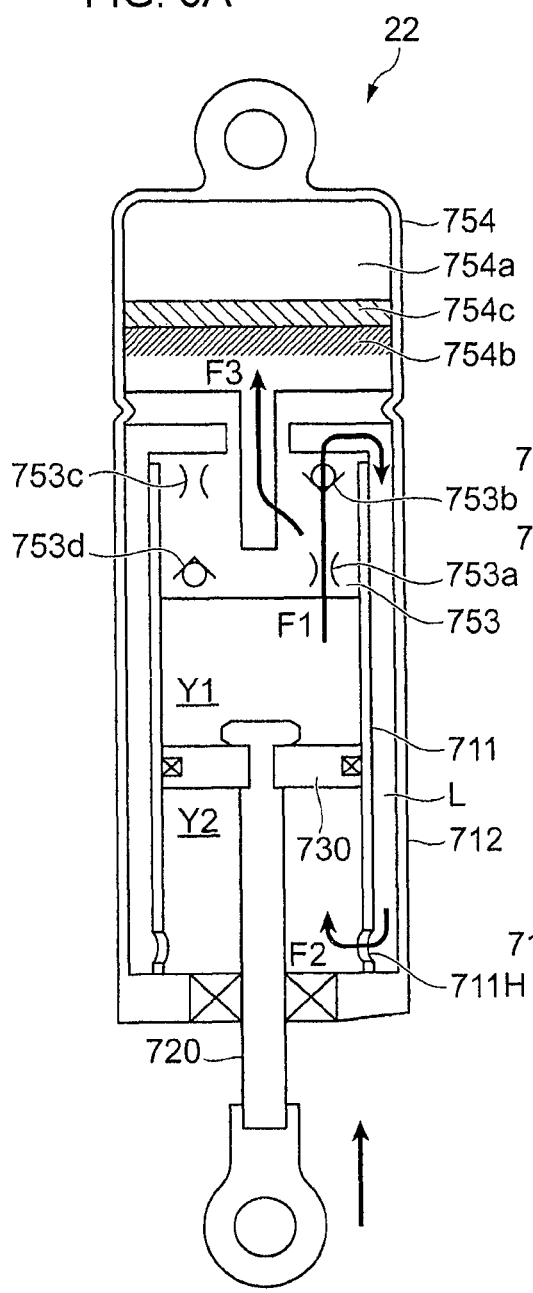
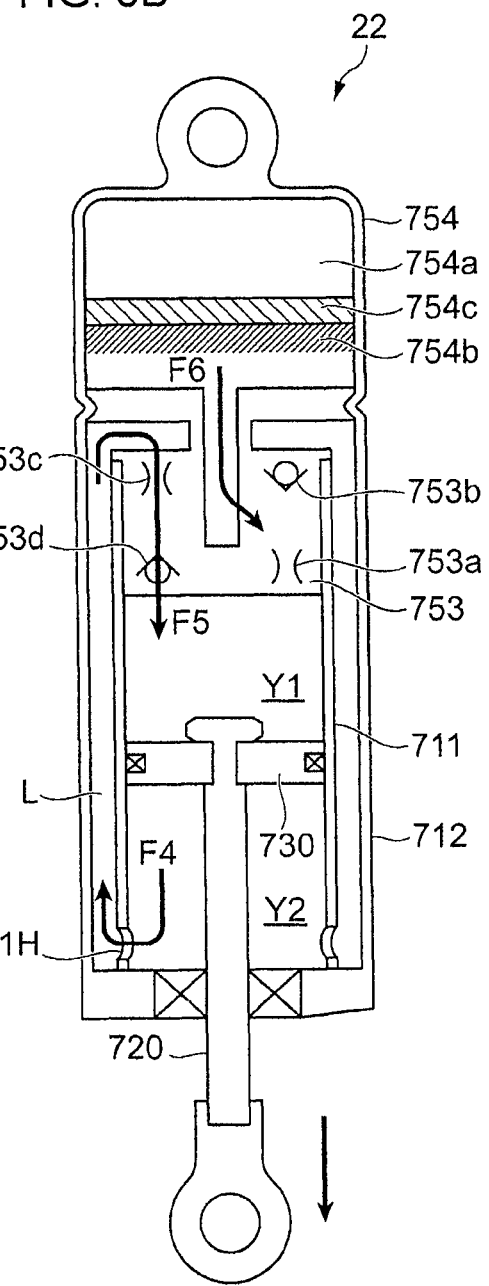

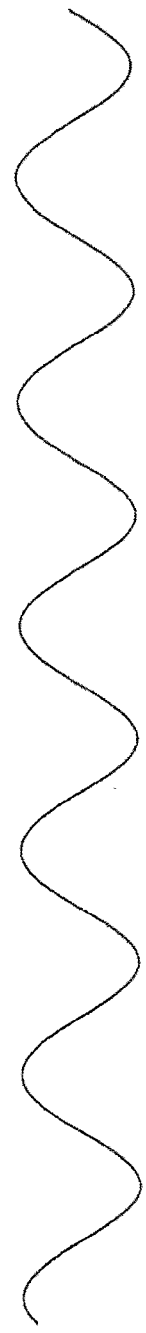
FIG. 11A  OSCILLATION WAVEFORM
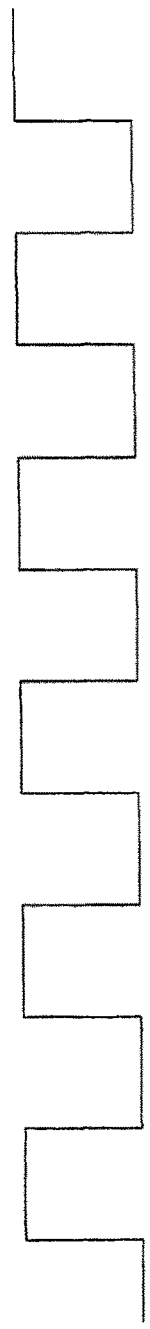
FIG. 11B  SHAPED WAVEFORM
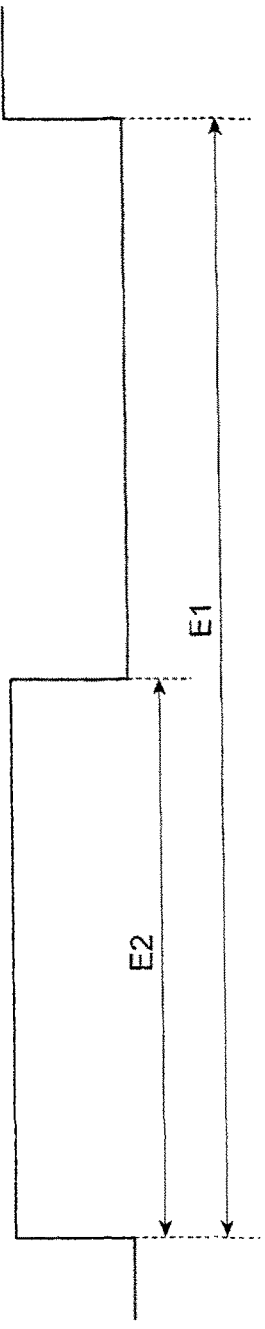
FIG. 11C  FREQUENCY-DIVIDED WAVEFORM

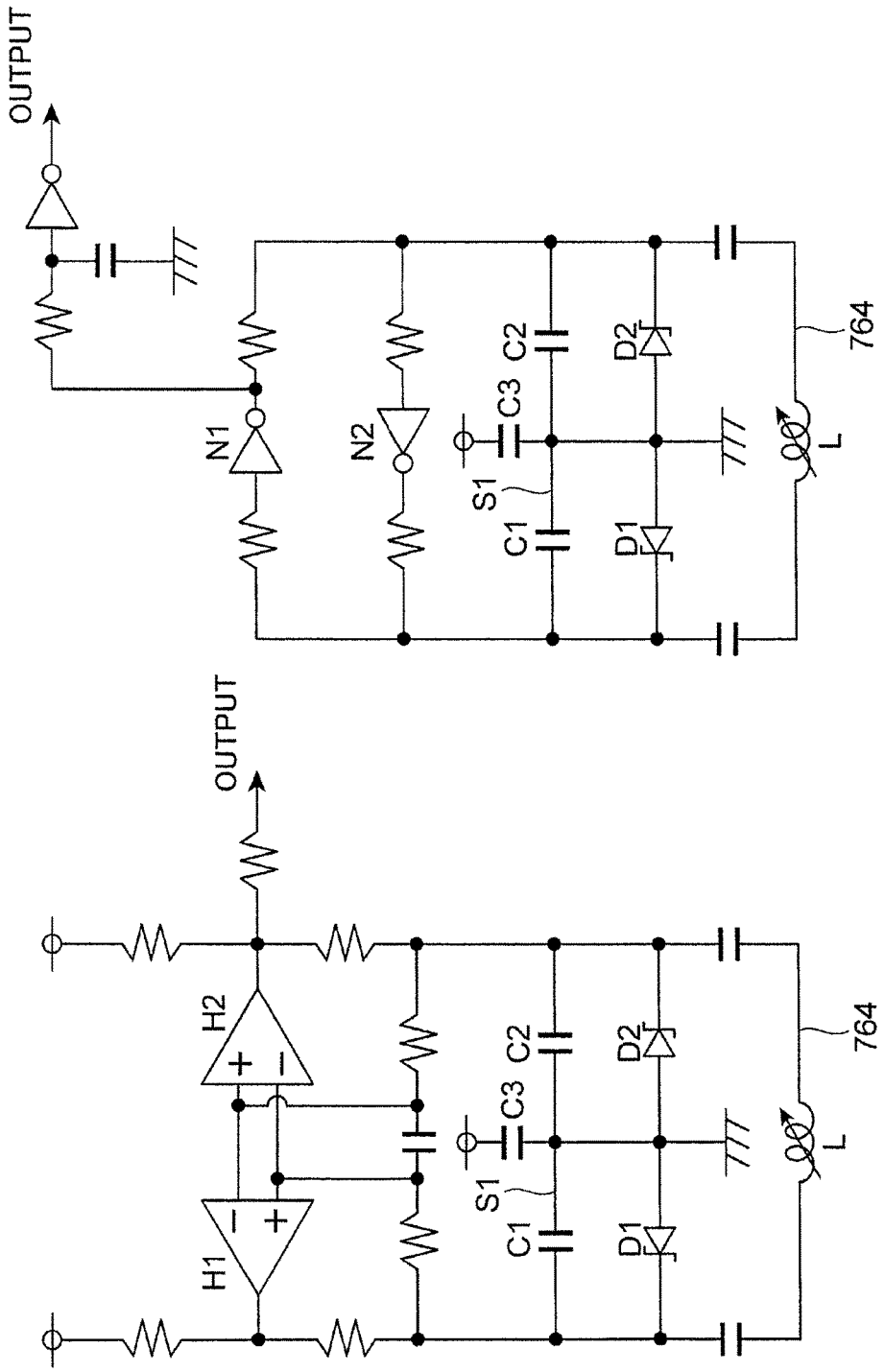

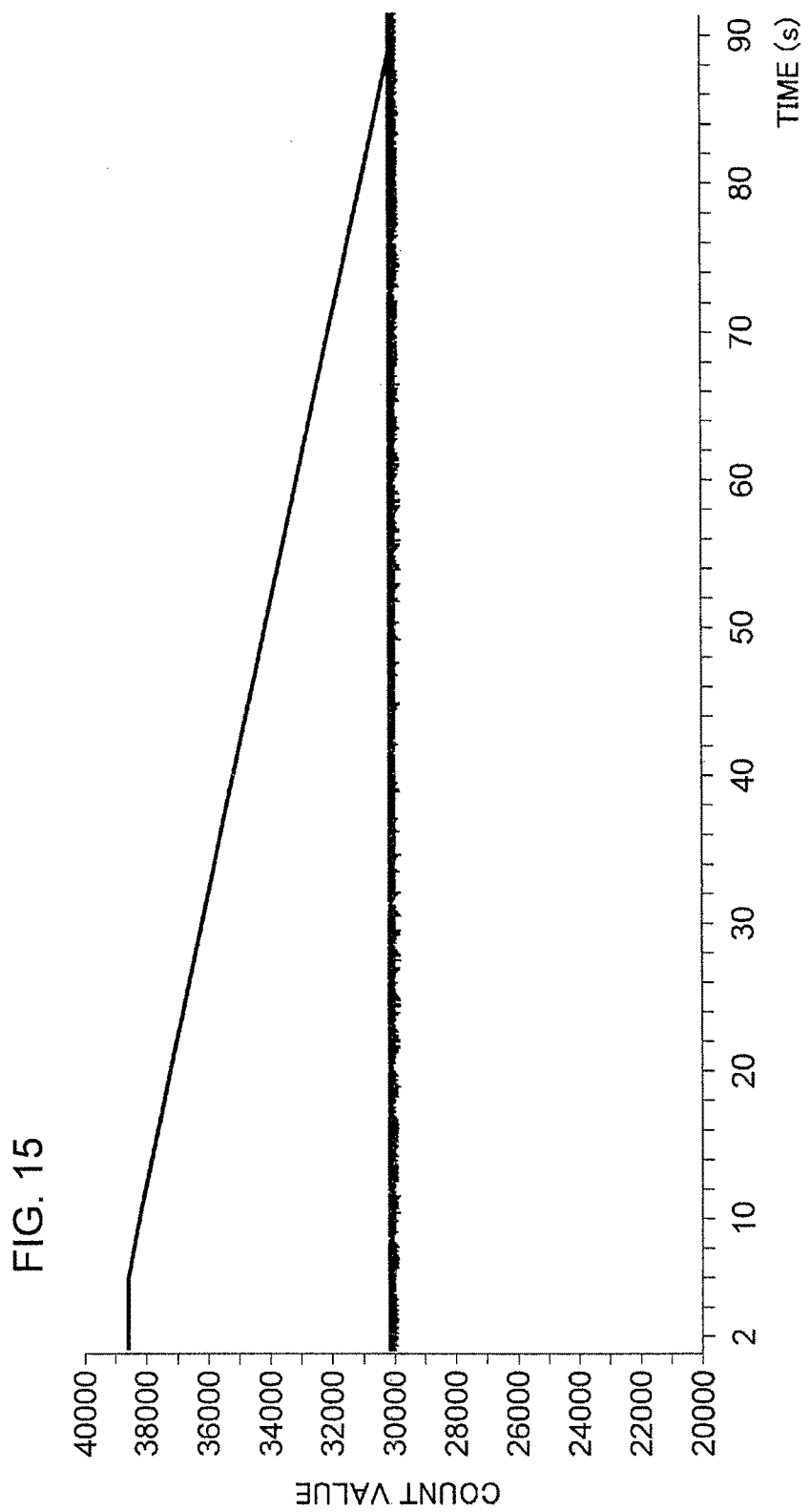

STROKE SENSOR SYSTEM AND LC OSCILLATION CIRCUIT

CROSS-REFERENCE TO RELATED APPLICATIONS

The present application claims priority under 35 U.S.C. § 119 to Japanese Patent Application No. 2015-047718, filed Mar. 10, 2015. The contents of this application are incorporated herein by reference in their entirety.

BACKGROUND OF THE INVENTION

1. Field of the Invention

The present invention relates to a stroke sensor system and an LC oscillation circuit.

2. Description of the Related Art

A vehicle such as a motorcycle includes a suspension for appropriately reducing vibration transmitted from a road surface to a vehicle body during traveling to improve riding comfort and operation stability. Further, by attaching a stroke sensor to the suspension, a stroke amount can be known.

WO2013/066158 describes a suspension assembly including an inner tube, an outer tube configured to move telescopically together with the inner tube, an electric insulation cover disposed to be stationary with respect to and coaxially overlap one of the inner tube and the outer tube and including an electric coil, an alternating current source combined with the electric coil to form an electric circuit, a detector that detects values of electric parameters such as an electric current and a voltage of the electric circuit that pass through the electric coil, and a processing unit for deducing relative positions of the inner tube and the outer tube using changes in the values of the electric parameters with respect to known values of the electric parameters in the relative positions of the inner tube and the outer tube.

Patent Document 1: WO2013/066158

There is a conventional stroke sensor including an LC oscillation circuit.

However, when the conventional LC oscillation circuit is used, the stroke sensor is easily affected by noise. Accuracy of a stroke amount output from the stroke sensor is sometimes deteriorated.

It is an object of the present invention to provide a stroke sensor system or the like which is less likely to be affected by noise and in which accuracy of a stroke amount to be output is easily improved.

SUMMARY OF THE INVENTION

In order to attain the object, the present invention provides a stroke sensor system including: a vehicle-body-side member formed in a tubular shape and located at a vehicle body side; a wheel-side member formed in a tubular shape, located at a wheel side, coupled to the vehicle-body-side member, and configured to move relatively to the vehicle-body-side member in an axial direction of the vehicle-body-side member; and a movement-amount deriving section configured to derive a movement amount of relative movement between the vehicle-body-side member and the wheel-side member. At least a part of one of the vehicle-body-side member and the wheel-side member is an electric conductor, and other of the vehicle-body-side member and the wheel-side member is provided with a coil. The movement-amount deriving section includes: an even number of capacitors electrically coupled to the coil and configuring an LC resonance section; and an even number of exciting sections for exciting an oscillation waveform output by the LC resonance section by the relative movement between the vehicle-body-side member and the wheel-side member. The even number of capacitors and the even number of exciting sections are divided into a plurality of (two or more) groups of same number (1 or more) of the capacitor(s) and a plurality of (two or more) groups of same number (1 or more) of the exciting section(s) respectively to configure a balanced circuit. The movement-amount deriving section derives the movement amount based on the oscillation waveform.

The stroke sensor system may further include a wire that couples in series the capacitors divided into the plurality of groups of same number of the capacitor(s). The wire may be grounded.

The exciting sections may output the oscillation waveform by differential comparison of potentials on both sides of the coil.

The stroke sensor system may further include a wire that couples the capacitors divided into the plurality of groups of same number of the capacitor(s), and a bypass capacitor that is provided at the wire.

The stroke sensor system may further include Zener diodes coupled in parallel to the capacitors divided into the plurality of groups of same number of the capacitor(s).

In order to attain the object, from another viewpoint, the present invention provides an LC oscillation circuit including: a coil; an even number of capacitors electrically coupled to the coil and configuring an LC resonance section; and an even number of exciting sections for exciting an oscillation waveform output by the LC resonance section. The even number of capacitors and the even number of exciting sections are divided into a plurality of (two or more) groups of same number (1 or more) of the capacitor(s) and a plurality of (two or more) groups of same number (1 or more) of the exciting section(s) respectively to configure a balanced circuit.

According to the present invention, it is possible to provide the stroke sensor system or the like which is less likely to be affected by noise and in which accuracy of a stroke amount to be output is easily improved.

BRIEF DESCRIPTION OF THE DRAWINGS

FIGS. 5A and 5B are schematic diagrams for explaining the operation of the rear suspension;

FIG. 11A is a diagram showing an oscillation waveform output from an oscillation circuit section, FIG. 11B is a diagram showing a shaped waveform shaped by an A/D conversion section, and FIG. 11C is a diagram showing a frequency-divided waveform divided by a frequency dividing section;

FIGS. 14A and 14B are diagrams showing examples of LC oscillation circuits used in the embodiment;

FIG. 15 is a diagram for explaining the influence of noise that occurs when the LC oscillation circuit in the embodiment is used;

DESCRIPTION OF THE PREFERRED EMBODIMENTS

An embodiment of the present invention is explained in detail below with reference to the accompanying drawings.
<Explanation of the Overall Configuration of a Motorcycle>

Figure 1:
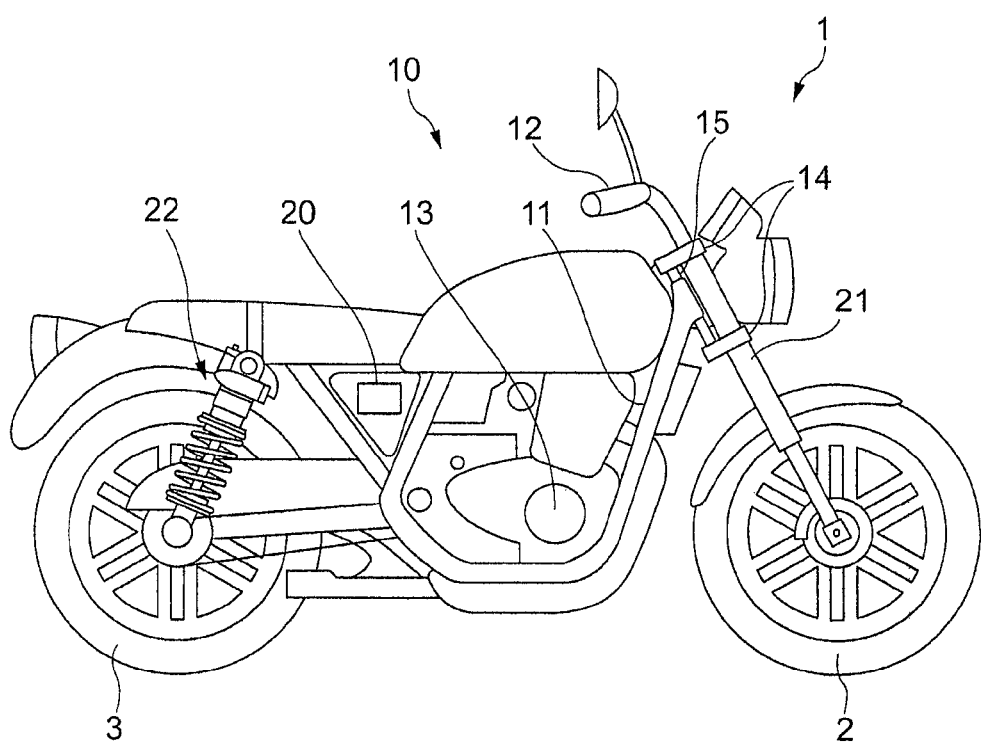
FIG. 1 is a diagram showing the schematic configuration of a motorcycle according to an embodiment.

FIG. 1 is a diagram showing the schematic configuration of a motorcycle 1 according to an embodiment.

The motorcycle 1 includes a front wheel 2, which is a wheel on the front side, a rear wheel 3, which is a wheel on the rear side, and a vehicle main body 10 including a vehicle body frame 11 forming a framework of the motorcycle 1, a handlebar 12, and an engine 13.

The motorcycle 1 includes front forks 21 respectively on the left side and the right side of the front wheel 2. The front forks 21 couple the front wheel 2 and the vehicle main body 10. The motorcycle 1 includes rear suspensions 22 respectively on the left side and the right side of the rear wheel 3. The rear suspensions 22 couple the rear wheel 3 and the vehicle main body 10. In FIG. 1, only the front fork 21 and the rear suspension 22 disposed on the right side are shown.

The motorcycle 1 includes two brackets 14 and a shaft 15 disposed between the two brackets 14. The brackets 14 hold the front fork 21 disposed on the left side of the front wheel 2 and the front fork 21 disposed on the right side of the front wheel 2. The shaft 15 is rotatably supported by the vehicle body frame 11.

The motorcycle 1 includes a control device 20 that controls the height of the motorcycle 1 by controlling a solenoid 310 of a channel switching unit 300 explained below of the front fork 21.

<Configuration and Functions of the Rear Suspension 22>

Figure 2:
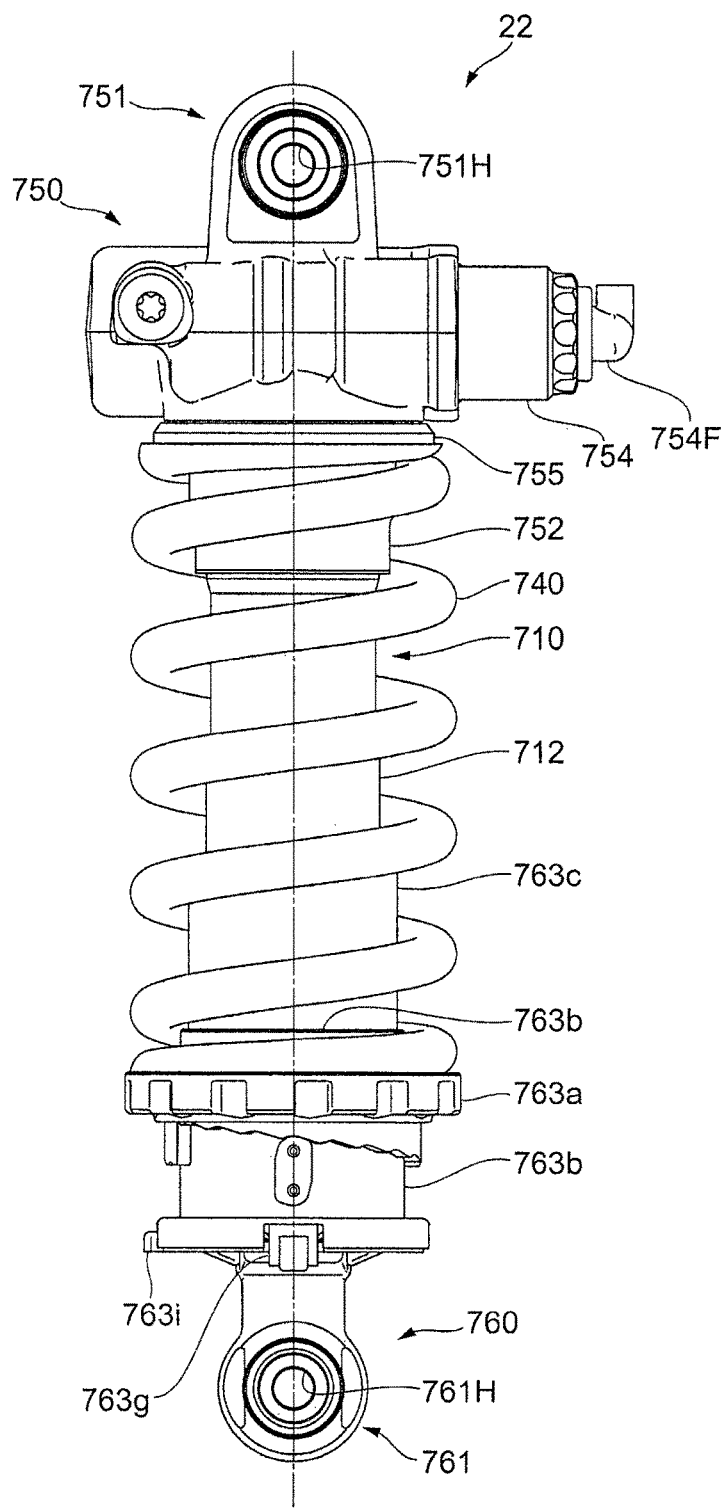
FIG. 2 is a diagram showing the exterior of a rear suspension in the embodiment.

FIG. 2 is a diagram showing the exterior of the rear suspension 22 in this embodiment.

Figure 3:
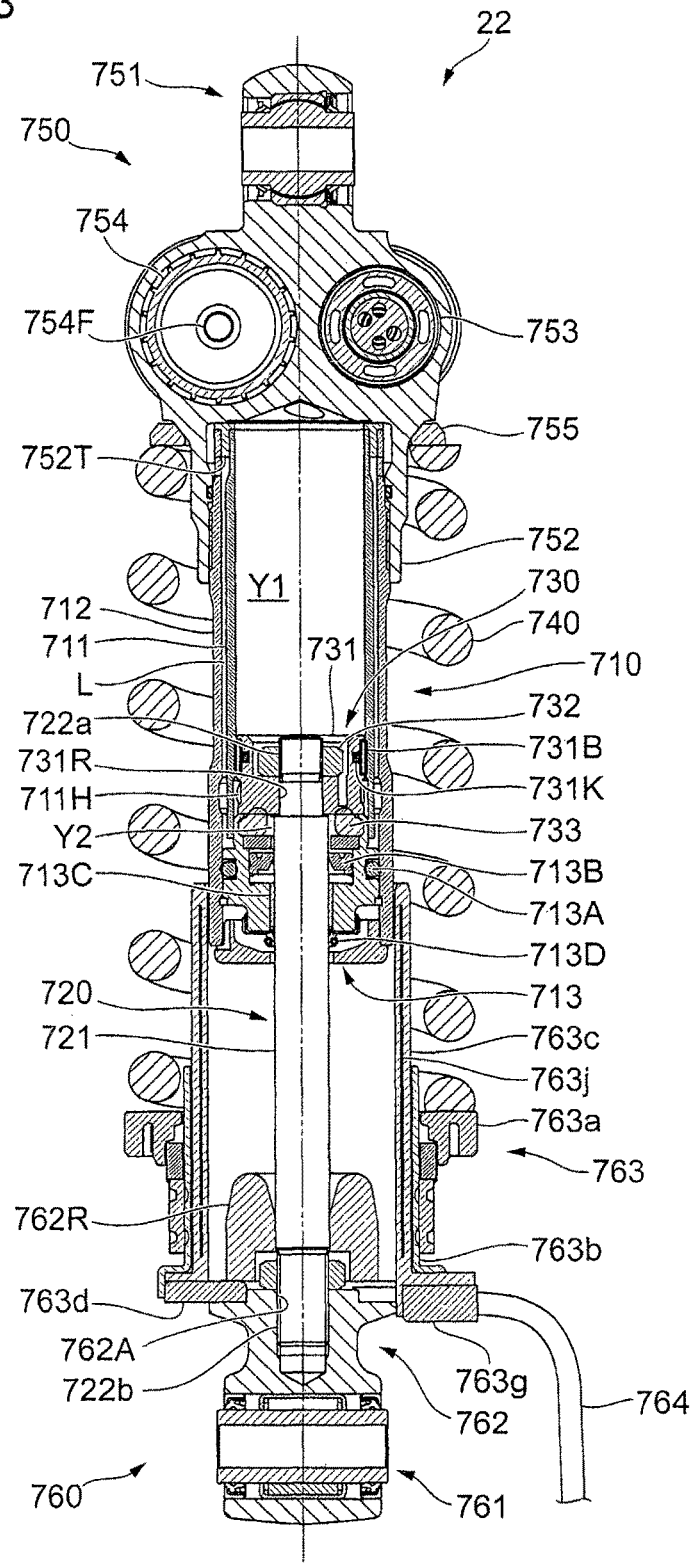
FIG. 3 is a sectional view of FIG. 2.

FIG. 3 is a sectional view of FIG. 2.

The rear suspension 22 includes a cylinder section 710, a piston rod 720, a piston 730, a coil spring 740, a vehicle-body-side attachment member 750, and an axle-side attachment member 760.

(Configuration of the Cylinder Section 710)

The cylinder section 710 includes a cylinder 711 and an outer cylinder 712 provided on the outer side of the cylinder 711. The cylinder 711 and the outer cylinder 712 are coaxially disposed.

The cylinder section 710 includes a rod guide 713 at the lower end portion.

Note that, in the following explanation, a center axis direction of cylinder of the outer cylinder 712 is simply referred to as "up-down direction". The rear wheel 3 side (a wheel side or an axle side) on the lower side in the figure in the up-down direction of the outer cylinder 712 is sometimes referred to as "lower side". The vehicle main body 10 side (a vehicle body side or a main body side) on the upper side in the figure in the up-down direction of the outer cylinder 712 is sometimes referred to as "upper side".

The cylinder 711 is a member having a thin cylindrical shape. Oil is stored on the inner side of the cylinder 711. In the cylinder 711, the piston 730 is provided to be slidable in the up-down direction on the inner circumferential surface. The piston 730 moves with the outer circumference of the piston 730 in contact with the inner circumference of the cylinder 711.

The cylinder 711 includes a cylinder opening 711H on the lower end side thereof and above the rod guide 713.

The outer cylinder 712 is a member having a thin cylindrical shape. The outer cylinder 712 is disposed with a predetermined space provided between the inner circumference thereof and the outer circumference of the cylinder 711. The outer cylinder 712 forms, between the outer cylinder 712 and the cylinder 711, a communication path L functioning as a route of the oil between the inner side of the cylinder 711 and a damping-force generating device 753 explained below.

The outer cylinder 712 functions as a vehicle-body-side member formed in a tubular shape and located on the vehicle body side. The outer cylinder 712 is made of an electric conductor such as aluminum.

Upper end portions in the up-down direction of the cylinder 711 and the outer cylinder 712 are attached to the vehicle-body-side attachment member 750. In this case, the cylinder 711 is attached by, for example, being pressed into the vehicle-body-side attachment member 750. The outer cylinder 712 by fitting a male screw formed in the vehicle-body-side attachment member 750 and a female screw formed in the outer cylinder 712.

The rod guide 713 is a member generally having a thin cylindrical shape and is held by the inner circumferential surface of the outer cylinder 712. The rod guide 713 is fixed in the up-down direction at the lower end portion of the outer cylinder 712 via an O-ring 713A. Consequently, the rod guide 713 closes the lower end portions in the up-down direction of the cylinder 711 and the outer cylinder 712.

The rod guide 713 holds the piston rod 720 in a hole on the inner side via an oil seal 713B, a bush 713C, and a dust seal 713D and supports the piston rod 720 to be movable.

(Configuration of the Piston Rod 720)

The piston rod 720 extends in the up-down direction and is coupled to the piston 730 at the upper end portion in the up-down direction.

The piston rod 720 is a solid or hollow bar-like member. The piston rod 720 includes a columnar or cylindrical rod section 721, includes, at the upper end portion in the up-down direction, an upper attachment section 722a for attaching the piston 730 and the like, and includes, at the lower end portion in the up-down direction, a lower attachment section 722b for attaching the piston rod 720 to the axle-side attachment ember 760. Spiral grooves are cut on the outer surfaces at the end portions of the upper attachment section 722a and the lower attachment section 722b to form male screws. The upper attachment section 722a and the lower attachment section 722b function as bolts.

(Configuration of the Piston 730)

The piston 730 includes a piston body 731, a nut 732 for attaching the piston body 731 to the upper attachment section 722a of the piston rod 720, and a rebound rubber 733.

The piston 730 is provided to be movable in the up-down direction in the cylinder 711 and divides a space in the cylinder 711 into a first oil chamber Y1 and a second oil chamber Y2 that store the oil.

The piston body 731 includes an attachment hole 731R formed in the up-down direction to allow the upper attachment section 722a of the piston rod 720 to pass therethrough, a bush 731B for sliding the piston body 731 in the up-down direction in the cylinder 711, and an O-ring 731K for liquid-tightly dividing the first oil chamber Y1 and the second oil chamber Y2.

When the cylinder section 710 is extended most in an extension stroke, the rebound rubber 733 absorbs a shock of contact of the upper end portion side of the rod guide 713 with the piston 730 and prevents damage to the piston 730 and the rod guide 713.

(Configuration of the Coil Spring 740)

The coil spring 740 expands and contracts to absorb vibration received by the rear wheel 3 according to unevenness of a road surface. That is, the coil spring 740 functions an elastic member that absorbs vibration between the vehicle body side and the axle side.

The upper end portion side in the up-down direction of the coil spring 740 comes into contact with a spring bearing 755 explained below, whereby the position on the upper end portion side in the up-down direction is specified. The lower end portion side in the up-down direction of the coil spring 740 comes into contact with a spring adjuster 763a, whereby the position on the lower end portion side in the up-down direction is specified.

(Configuration of the Vehicle-Body-Side Attachment Member 750)

The vehicle-body-side attachment member 750 includes a vehicle-body-side coupling member 751, a cylinder-section inserting section 752, a damping-force generating device 753, a sub-tank section 754, and a spring bearing 755.

The vehicle-body-side coupling member 751 includes a coupling hole 751H. An attachment member (not shown in the figure) provided on the vehicle main body 10 side is inserted into the coupling hole 751H to attach the rear suspension 22 to the vehicle main body 10 side.

The cylinder 711 and the outer cylinder 712 of the cylinder section 710 are inserted into the cylinder-section inserting section 752. The cylinder-section inserting section 752 is formed in a substantially cylindrical shape. The inner circumferential surface of the cylinder-section inserting section 752 is formed along the outer circumferential surface of the outer cylinder 712. The outer cylinder 712 is screwed to be inserted into the cylinder-section inserting section 752. The cylinder-section inserting section 752 includes a protrusion section 752T in a bottom section on the upper side. The cylinder 711 and the outer cylinder 712 are liquid-tightly divided by the protrusion section 752T. The cylinder 711 is pressed into the inner circumferential surface of the protrusion section 752T to insert the cylinder 711.

As explained in detail below, the damping-force generating device 753 generates a damping force when the cylinder 711 and the piston rod 720 relatively move. A damping valve is provided on the inside of the damping-force generating device 753. The damping force is generated by resistance that interrupts a flow of the oil generated by the damping valve.

In the sub-tank section 754, as explained in detail below, an air chamber and an oil reservoir chamber are provided on the inside. The air chamber and the oil reservoir chamber are divided by a bladder. The air can be injected into the air chamber from an air valve 754F. The pressure in the air chamber is increased by the injection of the air.

In an expansion stroke in which the cylinder 711 and the piston rod 720 move away from each other, a capacity occupied by the piston rod 720 in the cylinder 711 decreases. Therefore, the oil equivalent to the decrease in the capacity needs to be filled in the cylinder 711. In this case, the oil is fed into the first oil chamber Y1 via the bladder by the air pressure in the air chamber to adjust an oil amount.

In a compression stroke in which the cylinder 711 and the piston rod 720 move close to each other, the capacity occupied by the piston rod 720 in the cylinder 711 increases. Therefore, the oil equivalent to the increase in the capacity needs to be discharged from the cylinder 711. In this case, the oil is fed into the oil reservoir chamber to adjust the oil amount.

The spring bearing 755 specifies the position on the upper end portion side of the coil spring 740 as explained above.

(Configuration of the Axle-Side Attachment Member 760)

The axle-side attachment member 760 includes an axle-side coupling member 761, a piston-rod inserting section 762, a load adjusting device 763, and a signal line 764.

The axle-side coupling member 761 includes a coupling hole 761H. An axle of the rear wheel 3 is inserted into the coupling hole 761H to attach the rear suspension 22 to the axle.

In the piston-rod inserting section 762, a recess 762A for inserting the piston rod 720 is provided. The piston rod 720 is held by screwing a male screw, which is formed on the outer surface of the lower attachment section 722b of the piston rod 720, into a female screw formed on the inner circumferential surface of the recess 762A.

The piston-rod inserting section 762 includes a bump rubber 762R formed in a substantially annular shape. When the cylinder section 710 is compressed most in the compression stroke, the bump rubber 762R absorbs a shock of contact of the lower end portion side of the rod guide 713 with the axle-side attachment member 760 and prevents damage to the rod guide 713 and the like.

The load adjusting device 763 is a mechanism section that changes the position of the spring bearing in the up-down direction. The load adjusting device 763 changes the length of the coil spring 740 by changing the position of the spring bearing. As a result, it is possible to adjust the vehicle height and an initial load (a pre-load) of the coil spring 740.

Figure 4:
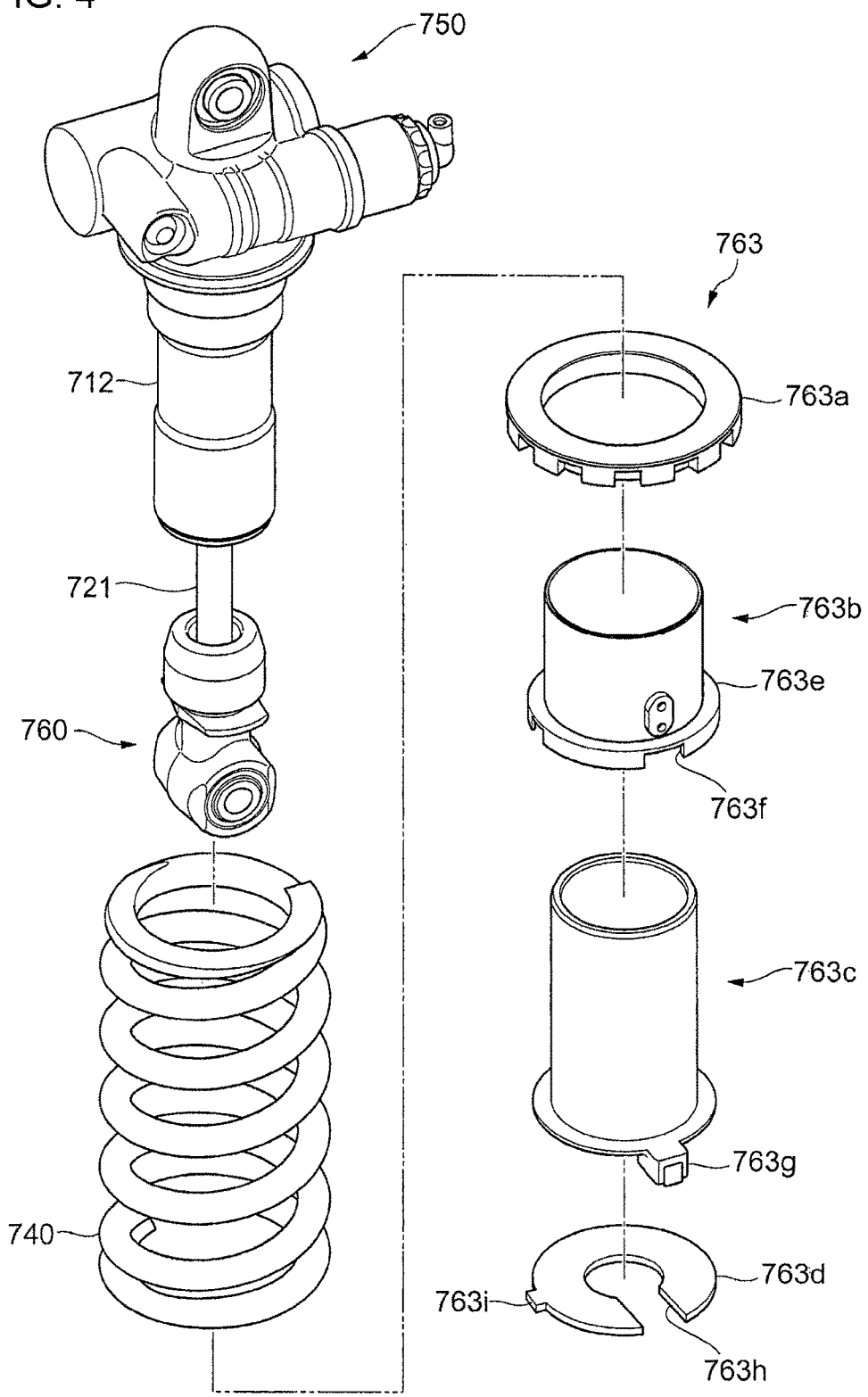
FIG. 4 is a diagram showing the configuration of a load adjusting device.

FIG. 4 is a diagram showing the configuration of the load adjusting device 763.

The load adjusting device 763 includes the spring adjuster 763a, a spring-bearing assisting member 763b, a guide 763c, and a spring bearing member 763d.

The load adjusting device 763 is configured by combining these four components as shown in FIG. 4. Specifically, the spring-bearing assisting member 763b includes an expanded tube section 763e on the lower end portion side and includes a cutout section 763f in the expanded tube section 763e. A plurality of cutout sections 763f are formed in the circumferential direction. The guide 763c includes a protrusion section 763g projecting in a direction orthogonal to the up-down direction. The guide 763c is inserted into the inner side of the spring-bearing assisting member 763b and the cutout section 763f and the protrusion section 763g fit with each other, whereby the spring-bearing assisting member 763b and the guide 763c are combined. The spring bearing member 763*d* includes a cutout section 763*h*. The protrusion section 763*g* and the cutout section 763*h* fit with each other, whereby the guide 763*c* and the spring bearing member 763*d* are combined. Further, the spring bearing member 763*d* includes a protrusion section 763*i*. The cutout section 763*f* and the protrusion section 763*i* fit with each other, whereby the spring-bearing assisting member 763*b* and the spring bearing member 763*d* are combined.

The spring adjuster 763*a* is formed in a substantially annular shape. The upper surface of the spring adjuster 763*a* is in contact with the coil spring 740. When the spring adjuster 763*a* rotates, the position of the spring adjuster 763*a* in the up-down direction changes and the position on the lower side of the coil spring 740 can be adjusted. Consequently, the length of the coil spring 740 is changed.

The spring-bearing assisting member 763*b* is formed in a substantially cylindrical shape and is a member for transmitting force acting from the coil spring 740 to the spring-bearing assisting member 763*b*.

The guide 763*c* is formed in a substantially cylindrical shape and is made of resin or the like. The guide 763*c* is a member for protecting the piston rod 720. That is, the guide 763*c* plays a role of a protector provided to protect the piston rod 720 from a flying stone and the like. If the guide 763*c* is not provided, the piston rod 720 is damaged and the oil seal is easily broken. When the oil seal is broken, the oil leaks to the outside and sometimes causes a trouble in the operation of the rear suspension 22.

The guide 763*c* covers an entire exposed section formed on the lower side in the up-down direction of the piston rod 720. The inner circumference of the guide 763*c* and the outer circumference of the outer cylinder 712 relatively move while being in contact with each other. The guide 763*c* is formed in a tubular shape, located on the rear wheel 3 side, and coupled to the outer cylinder 712. The guide 763*c* functions as an axle-side member that moves relatively to the outer cylinder 712 in the up-down direction of the outer cylinder 712.

As explained in detail below, the guide 763*c* includes a coil 763*j* configuring a stroke sensor system.

The spring bearing member 763*d* includes the cutout section 763*h* in a substantially annular shape. Therefore, the spring bearing member 763*d* is formed in a substantially C shape. The spring bearing member 763*d* plays a role of a receiving member that transmits force acting from the coil spring 740 to the axle-side coupling member 761 side in conjunction with the spring adjuster 763*a* and the spring-bearing assisting member 763*b*. The inner circumference side of the spring bearing member 763*d* is fit in the piston-rod inserting section 762 and the outer circumference side of the spring bearing member 763*d* is fit in the inner side of the expanded tube section 763*e* of the spring-bearing assisting member 763*b*. Consequently, the spring bearing member 763*d* specifies the axis positions of the spring-bearing assisting member 763*b* and the guide 763*c* and fixes the coil spring 740. When the spring bearing member 763*d* is attached, the coil spring 740, the spring adjuster 763*a*, the spring-bearing assisting member 763*b*, and the guide 763*c* are inserted into the outer cylinder 712 and the piston rod 720 in order in the up-down direction from the lower side to the upper side. The coil spring 740 is once contracted. The spring bearing member 763*d* is inserted from a direction orthogonal to the up-down direction. Since the cutout section 763*h* is present, the piston rod 720 can be inserted through from the outer circumference side to the inner circumference side of the spring bearing member 763*d* in the part of the cutout section 763*h*. Then, the coil spring 740 is extended, the inner circumference side of the spring bearing member 763*d* is fit in the axle-side coupling member 761, and the outer circumference side of the spring bearing member 763*d* is fit in the inner side of the expanded tube section 763*e* of the spring-bearing assisting member 763*b*. Further, the protrusion section 763*i* is fit in the cutout section 763*f* of the spring-bearing assisting member 763*b*.

The signal line 764 is coupled to the coil 763*j* on the inside of the guide 763*c* of the load adjusting device 763 and extracts an electric current generated in the coil 763*j* to the outside of the rear suspension 22. At this point, the coil 763*j* and the signal line 764 are electrically coupled via a protrusion section 763*g*. For example, the signal line 764 may be directly coupled to the coil 763*j* through the part of the protrusion section 763*g*. The part of the protrusion section 763*g* may be formed as a connector (a coupler) and the signal line 764 may be coupled using the connector. In this case, a connector on the signal line 764 side is inserted into the connector of the protrusion section 763*g* from the lower side to the upper side to couple the signal line 764.

That is, in this embodiment, making use of formation of an air gap in the part of the cutout section 763*h* of the spring bearing member 763*d*, wiring is applied to the part to electrically couple the coil 763*j* and the signal line 764. When the signal line 764 is not inserted through this part, interference with other members easily occurs. It is difficult to electrically couple the coil 763*j* and the signal line 764.

<Explanation of the Operation of the Rear Suspension 22>

FIGS. 5A and 5B are schematic diagrams for explaining the operation of the rear suspension 22.

In the rear suspension 22 in this embodiment, the second oil chamber Y2 and the communication path L are coupled via the cylinder opening 711H provided in the cylinder 711. The communication path L is coupled to the first oil chamber Y1 via the damping-force generating device 753. The damping-force generating device 753 and an oil reservoir chamber 754*b* of the sub-tank section 754 are coupled.

FIG. 5A illustrates the compression stroke in which the cylinder 711 and the piston rod 720 move to approach each other.

In the compression stroke, for example, the piston rod 720 and the piston 730 move to the upper side in the figure. According to the movement of the piston 730, the oil in the first oil chamber Y1 flows into the damping-force generating device 753 as indicated by an arrow F1. In the damping-force generating device 753, a compression check valve 753*b* opens and a compression damping valve 753*a* opens. The compression damping valve 753*a* is configured by stacking a plurality of substantially disc-like metal plates. The oil passes through the compression damping valve 753*a* while bending and opening the metal plates. Therefore, in the compression damping valve 753*a*, resistance that interrupts the flow of the oil is generated in the compression damping valve 753*a* and a compression damping force is generated. The oil passed through the compression check valve 753*b* flows into the communication path L. Further, the oil flows into the second oil chamber Y2 via the cylinder opening 711H as indicated by an arrow F2.

At this point, since the piston rod 720 enters the second oil chamber Y2, the capacity in the cylinder 711 decreases. Therefore, an excess occurs in the oil. The excess oil flows into an oil reservoir chamber 754*b* of the sub-tank 754 as indicated by an arrow F3 and is discharged. At this point, the oil flows into the oil reservoir chamber 754*b* resisting pressure applied from an air chamber 754*a* via a bladder 754*c*.

FIG. 5B illustrates the extension stroke in which the cylinder 711 and the piston rod 720 move away from each other.

In the extension stroke, for example, the piston rod 720 and the piston 730 move to the lower side in the figure. At this point, since the piston 730 moves, the oil in the second oil chamber Y2 flows into the communication path L via the cylinder opening 711H as indicated by an arrow F4. Further, the oil in the communication path L flows into the damping-force generating device 753 as indicated by an arrow F5. In the damping-force generating device 753, an extension check valve 753d opens and an extension damping valve 753c opens. The extension damping valve 753c has a configuration same as the configuration of the compression damping valve 753a. Therefore, resistance that interrupts the flow of the oil is generated in the extension damping valve 753c and an extension damping force is generated. The oil passed through the extension check valve 753d flows into the first oil chamber Y1.

At this point, since the piston rod 720 exits the second oil chamber Y2, the capacity in the cylinder 711 increases. Therefore, a shortage of the oil occurs. The oil for covering the shortage flows from the oil reservoir chamber 754b of the sub-tank section 754 and filled in the cylinder 711 as indicated by an arrow F6. At this point, the oil is discharged from the oil reservoir chamber 754b by pressure applied from the air chamber 754a via the bladder 754c.

<Configuration and Functions of the Front Fork 21>

The front fork 21 is explained in detail.

Figure 6:
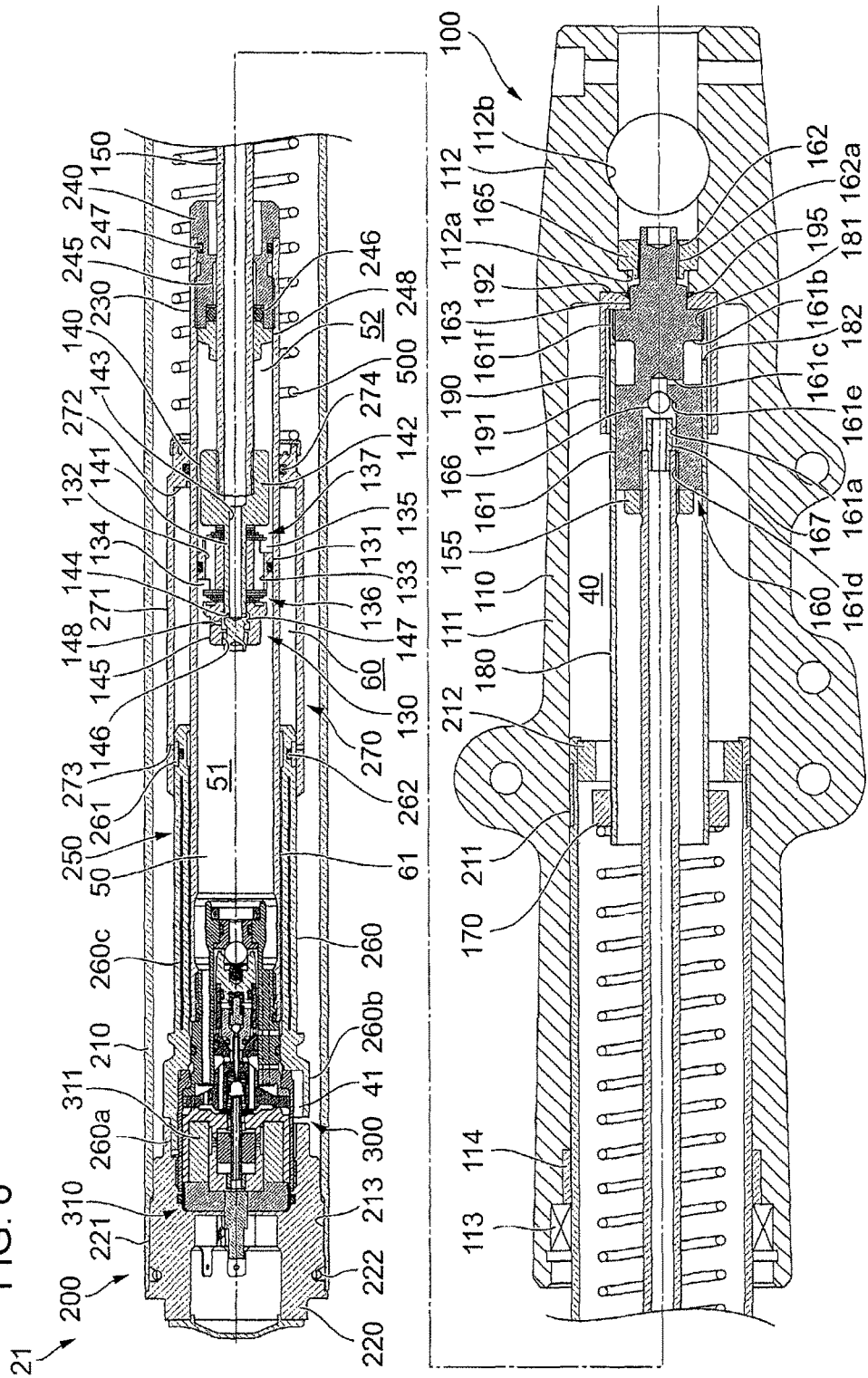
FIG. 6 is a sectional view of a front fork according to the embodiment of the present invention.

FIG. 6 is a sectional view of the front fork 21 according to the embodiment of the present invention.

The front fork 21 according to this embodiment is a front fork of a so-called upright type that is disposed between the vehicle main body 10 and the front wheel 2 of the motorcycle 1 and supports the front wheel 2 and in which an outer member 110 explained below is disposed on the front wheel 2 side and an inner tube 210 is disposed on the vehicle main body 10 side.

The front fork 21 includes an axle-side unit 100 including an outer member 110 and attached to the axle of the front wheel 2 and a main-body-side unit 200 including the inner tube 210 and attached to the vehicle main body 10. The front fork 21 includes a spring 500 that is disposed between the axle-side unit 100 and the main-body-side unit 200 and absorbs vibration received by the front wheel 2 according to unevenness of a road surface.

The outer member 110 and the inner tube 210 are cylindrical member disposed coaxially. The direction of the center line of the cylinder (the axial direction) is sometimes referred to as "up-down direction" in the following explanation. The vehicle main body 10 side is sometimes referred to as upper side and the front wheel 2 side is sometimes referred to as lower side. The axle-side unit 100 and the main-body-side unit 200 relatively move in the up-down direction (the axial direction), whereby the front fork 21 absorbs the unevenness of the road surface and suppresses the vibration while supporting the front wheel 2.

[Configuration of the Axle-Side Unit 100]

The axle-side unit 100 includes the outer member 110 attached to the axle of the front wheel 2, a damping-force generating unit 130 that generates a damping force making use of viscous resistance of the oil, a rod 150 that holds the damping-force generating unit 130, and a rod holding member 160 that holds the lower end portion of the rod 150.

The axle-side unit 100 includes a ball 166 inserted into an axial-direction recess 161a explained below of the rod holding member 160 and a limiting member 167 that limits the movement of the ball 166.

The axle-side unit 100 includes a spring-supporting member 170 that supports the lower end portion of the spring 500, a supporting-member holding member 180 that holds the spring supporting member 170, and a guide member 190 that guides the movement in the axial direction of the inner tube 210.

(Configuration of the Outer Member 110)

The outer member 110 includes a cylindrical section 111 into which the inner tube 210 is inserted and an axle bracket section 112 to which the axle of the front wheel 2 can be attached.

The cylindrical section 111 includes, at the upper end portion, an oil seal 113 that seals a space between the cylindrical section 111 and the outer circumferential surface of the inner tube 210 and a slide bush 114 for smoothing sliding with the outer circumferential surface of the inner tube 210.

In the axle bracket section 112, an axial-direction through-hole 112a in the axial direction into which the rod holding member 160 is inserted and an axle attaching hole 112b that pierces through the axle bracket section 112 in a direction orthogonal to the axial direction and to which the axle of the front wheel 2 can be attached are formed.

(Configuration of the Damping-Force Generating Unit 130)

The damping-force generating unit 130 includes a piston 131 that divides the inside of an hydraulic oil chamber 50 formed in a space on the inner side of a cylinder 230 explained below, an upper-end-side valve 136 provided on the upper end side of the piston 131, and a lower-end-side valve 137 provided on the lower end side of the piston 131. The damping-force generating unit 130 includes a piston bolt 140 that supports the piston 131, the upper-end-side valve 136, and the lower-end-side valve 137 and a nut 145 to be tightened with the piston bolt 140 to define the positions of the piston 131, the upper-end-side valve 136, the lower-end-side valve 137, and the like.

The piston 131 is a cylindrical member and includes, on the outer circumferential surface, a seal member that seals a gap between the piston 131 and the cylinder 230. In the piston 131, a first through-hole 132 and a second through-hole 133, which are through-holes in the axial direction, are formed. In the piston 131, a first radial-direction communication path 134 formed at the upper end portion to extend in the radial direction and communicating with the first through-hole 132 and a second radial-direction communication path 135 formed at the lower end portion to extend in the radial direction and communicating with the second through-hole 133 are formed. A plurality of (e.g., three) first through-holes 132 and a plurality of second through-holes 133 are formed at equal intervals in the circumferential direction. The first radial-direction communication path 134 and the second radial-direction communication path 135 are respectively formed in positions corresponding to the first through-hole 132 and the second through-hole 133.

The upper-end-side valve 136 configured by stacking a plurality of disc-like metal plates. In the upper-end-side valve 136, through-holes are formed in the centers of the respective metal plates. A shaft section 141 explained below of the piston bolt 140 is inserted through the through-holes. The upper-end-side valve 136 closes the second through-hole 133 and opens the first through-hole 132.

The lower-end-side valve 137 is configured by stacking a plurality of disc-like metal plates. In the lower-end-side valve 137, through-holes are formed in the centers of the respective metal plates. The shaft section 141 explained below of the piston bolt 140 is inserted through the through-holes. The lower-end-side valve 137 closes the first through-hole 132 and opens the second through-hole 133.

The piston bolt 140 includes a columnar shaft section 141 provided on the upper end side and a columnar base section 142 provided on the lower end side and having a radius larger than the radius of the shaft section 141. In the piston bolt 140, a recess 143 recessed from the lower end face of the base section 142 to the shaft section 141 is formed.

A male screw to be screwed into a female screw formed in the nut 145 is formed at the upper end portion of the shaft section 141.

On the inner circumferential surface of the lower end portion in the recess 143, a female screw to be screwed with a male screw formed at the upper end portion of the rod 150 is formed. At the upper end portion in the recess 143, a radial-direction through-hole 144 piercing through the upper end portion in the radial direction to allow the outer side of the shaft section 141 and the recess 143 to communicate is formed.

In the nut 145, a female screw 146 to be screwed with a male screw of the piston bolt 140 is formed at the upper end portion, and a columnar recess 147 recessed from the lower end face thereof and having a radius larger than the root radius of the female screw 146 is formed below the female screw 146. In the nut 145, a radial-direction through-hole 148 piercing through the nut 145 in the radial direction to allow the outside of the nut 145 and the recess 147 to communicate is formed.

The male screw formed at the upper end portion of the rod 150 is screwed into the female screw formed in the recess 143 of the piston bolt 140, whereby the damping-force generating unit 130 configured as explained above is held by the rod 150. The piston 131 comes into contact with the inner circumferential surface of the cylinder 230 via a seal member provided on the outer circumferential surface of the piston 131 and divides a space in the cylinder 230 into a first oil chamber 51 above the piston 131 and a second oil chamber 52 below the piston 131.

(Configuration of the Rod 150)

The rod 150 is a cylindrical member. Male screws are formed on the outer circumferential surfaces at the upper end portion and the lower end portion. The male screw formed at the upper end portion is tightened with the piston bolt 140 of the damping-force generating unit 130. The male screw formed at the lower end portion is screwed into a female screw 161d formed in an upper-end-side columnar section 161 of the rod holding member 160. A lock nut 155 is tightened with the male screw formed at the lower end portion, whereby the rod holding member 160 is fixed.

A female screw is formed on the inner circumferential surface of the lower end portion of the rod 150.

(Configuration of the Rod Holding Member 160)

The rod holding member 160 is a member including a plurality of columnar parts having diameters different from one another. The rod holding member 160 includes an upper-end-side columnar section 161 present at the upper end portion, a lower-end-side columnar section 162 present at the lower end portion, and an intermediate columnar section 163 present between the upper-end-side columnar section 161 and the lower-end-side columnar section 162.

In the upper-end-side columnar section 161, an axial-direction recess 161a recessed in the axial direction from the upper end face, a radial-direction recess 161b recessed over the entire circumference in the radial direction from the outer circumferential surface, and a radial-direction through-hole 161c piercing through the axial-direction recess 161a and the radial-direction recess 161b in the radial direction are formed.

In the axial-direction recess 161a, a female screw 161d to be screwed with the male screw formed at the lower end portion of the rod 150 is formed. In the axial-direction recess 161a, an inclined surface 161e inclining with respect to the axial direction to be gradually reduced in the inner diameter downward is formed.

At the lower end portion in the upper-end-side columnar section 161, a male screw 161f to be screwed into a female screw formed in the supporting-member holding member 180 is formed.

The diameter of the intermediate columnar section 163 is smaller than the inner diameter of the axial-direction through-hole 112a formed in the outer member 110. The intermediate columnar section 163 is fit in the axial-direction through-hole 112a of the outer member 110.

A male screw 162a is formed on the outer circumferential surface of the lower-end-side columnar section 162.

The male screw 162a formed in the lower-end-side columnar section 162 is tightened with a nut 165 inserted into the axial-direction through-hole 112a of the outer member 110, whereby the rod holding member 160 is fixed to the outer member 110.

(Configuration of the Limiting Member 167)

The limiting member 167 is a member having a stepped cylindrical shape. A male screw is formed on the outer circumferential surface of the upper end portion of the limiting member 167. The male screw is screwed into a female screw formed on the inner circumferential surface of the lower end portion of the rod 150, whereby the limiting member 167 is fixed to the rod 150. The limiting member 167 limits, at the lower end portion, movement of the ball 166 inserted into the axial-direction recess 161a of the rod holding member 160.

(Configuration of the Spring Supporting Member 170)

The spring supporting member 170 is a cylindrical member and fixed to the upper end portion in the supporting-member holding member 180. As a fixing method, welding and press-in can be illustrated.

(Configuration of the Supporting-Member Holding Member 180)

The supporting-member holding member 180 is a cylindrical member. A female screw 181 to be screwed with the male screw 162a formed in the rod holding member 160 is formed at the lower end portion. The female screw 181 is screwed with the male screw 162a formed in the rod holding member 160, whereby the supporting-member holding member 180 is fixed to the rod holding member 160.

In the supporting-member holding member 180, a communication hole 182 that allows the inside and the outside to communicate is formed in a position corresponding to the radial-direction recess 161b of the rod holding member 160 in a position in the axial direction.

(Configuration of the Guide Member 190)

The guide member 190 includes a cylindrical section 191 and an inward section 192 formed to extend from the lower end portion to the inner side in the radial direction in the cylindrical section 191.

The inward section 192 is held between the rod holding member 160 and the outer member 110, whereby the guide member 190 is fixed between the rod holding member 160 and the outer member 110.

A chamfer is formed at the lower end portion in the inward section 192. An O-ring 195 is fixed in a space formed between the chamfer and the rod holding member 160. The 0-ring 195 seals gaps between the guide member 190 and the rod holding member 160 and the outer member 110. Consequently, an inner space of the cylindrical section 111 of the outer member 110 is liquid-tightly held.

In the axle-side unit 100 configured as explained above, a reservoir chamber 40 that stores the oil sealed in the front fork 21 is formed between the inner circumferential surface of the outer member 110 and the outer circumferential surfaces of the rod 150 and the supporting-member holding member 180.

[Configuration of the Main-Body-Side Unit 200]

The main-body-side unit 200 includes the cylindrical inner tube 210 opened at both ends and a cap 220 attached to the upper end portion in the inner tube 210.

The main-body-side unit 200 includes the cylindrical cylinder 230 and a sealing member 240 attached to the lower end portion in the cylinder 230 to seal the space in the cylinder 230.

The main-body-side unit 200 includes a spring-length changing unit 250 that supports the upper end portion of the spring 500 and changes the length of the spring 500 and a channel switching unit 300 that is attached to the upper end portion in the cylinder 230 and switches a channel of oil, which is an example of working fluid.

(Configuration of the Inner Tube 210)

The inner tube 210 is a cylindrical member.

The inner tube 210 includes, at the lower end portion, a cylindrical slide bush 211 for smoothing sliding with the inner circumferential surface of the cylindrical section 111 of the outer member 110 and a cylindrical movement suppressing member 212 that suppresses movement in the axial direction by colliding with the spring supporting member 170 and the axle bracket section 112 of the outer member 110.

At the upper end portion in the inner tube 210, a female screw 213 to be screwed with a male screw explained below formed in the cap 220 is formed.

(Configuration of the Cap 220)

The cap 220 is a substantially cylindrical member. On the outer circumferential surface of the cap 220, a male screw 221 to be screwed into the female screw 213 formed in the inner tube 210 is formed. On the inner circumferential surface, a female screw to be screwed with male screws formed in the spring-length changing unit 250 and the channel switching unit 300 is formed. The cap 220 is attached to the inner tube 210 and holds the spring-length changing unit 250 and the channel switching unit 300.

The cap 220 includes an O-ring 222 for keeping an inner space of the inner tube 210 liquid tight.

(Configuration of the Cylinder 230)

The cylinder 230 is a cylindrical member. On the outer circumferential surface of the upper end portion in the cylinder 230, a female screw to be screwed with the male screw formed in the channel switching unit 300 is formed. On the inner circumferential surface of the lower end portion, a female screw to be screwed with a male screw formed in the sealing member 240 is formed.

(Configuration of the Sealing Member 240)

The sealing member 240 is a cylindrical member. On the outer circumferential surface of the sealing member 240, a male screw to be screwed into the female screw formed on the inner circumferential surface of the lower end portion of the cylinder 230 is formed. The male screw is screwed into the female screw formed on the inner circumferential surface of the lower end portion of the cylinder 230, whereby the sealing member 240 is held by the cylinder 230.

The sealing member 240 includes, on the inner circumference side, a slide bush 245 for smoothing sliding with the outer circumferential surface of the rod 150. In order to keep the inner space of the cylinder 230 liquid tight, the sealing member 240 includes an O-ring 246 disposed between the sealing member 240 and the outer circumferential surface of the rod 150 and an O-ring 247 disposed between the sealing member 240 and the inner circumferential surface of the cylinder 230.

A shock absorbing member 248 that absorbs a shock of contact with the damping-force generating unit 130 is attached to the upper end portion of the sealing member 240. As the shock absorbing member 248, an elastic member such as resin or rubber can be illustrated.

(Configuration of the Spring-Length Changing Unit 250)

The spring-length changing unit 250 includes a base member 260 fixed to the cap 220 and an upper-end-portion supporting member 270 that supports the upper end portion of the spring 500 and moves in the axial direction relatively to the base member 260 to change the length of the spring 500. The upper-end-portion supporting member 270 is made of an electric conductor such as aluminum. The upper-end-portion supporting member 270 is formed in a tubular shape, located on the rear wheel 3 side, and coupled to the base member 260. The upper-end-portion supporting member 270 functions as an axle-side member that moves relatively to the base member 260 in the up-down direction of the base member 260.

The base member 260 is a substantially cylindrical member. On the outer circumferential surface of the upper end portion in the base member 260, a male screw 260a to be screwed into a female screw formed in the cap 220 is formed. The male screw 260a is screwed into the female screw formed in the cap 220, the base member 260 is fixed to the cap 220. The base member 260 is formed in a tubular shape and functions as a vehicle-body-side member located on the vehicle body side. As explained in detail below, a coil 260c configuring the stroke sensor system is molded on the inside of the base member 260.

However, at the upper end portion of the base member 260, a projecting section 260b, a part of which in the circumferential direction projects in the radial direction, is formed. A discharge channel 41 that discharges the oil in the cylinder 230 to the reservoir chamber 40 is formed on the inner side of the projecting section 260b.

The base member 260 includes, at the lower end portion, a cylindrical slide bush 261 fit in the outer circumference to smooth sliding with the inner circumferential surface of the upper-end-portion supporting member 270 and an O-ring 262 provided on the inner side of the slide bush 261. An annular channel 61 is formed between the inner circumferential surface of the base member 260 and the outer circumferential surface of the cylinder 230.

The upper-end-portion supporting member 270 includes a cylindrical section 271 and an inward section 272 formed to extend from the lower end portion to the inner side in the radial direction in the cylindrical section 271. In the upper-end-portion supporting member 270, a jack chamber 60 that stores oil for changing the position of the upper-end-portion supporting member 270 with respect to the base member 260 is formed in a space between the outer circumferential surface of the cylinder 230 and the lower end portion of the base member 260.

The inner diameter of the cylindrical section 271 is set to be equal to or smaller than the outer diameter of the slide bush 261 fit in the base member 260. In the cylindrical section 271, a radial-direction through-hole 273 piercing through the cylindrical section 271 in the radial direction to allow the inside and the outside of the cylindrical section 271 to communicate is formed. The oil is discharged from the jack chamber 60 to the reservoir chamber 40 via the radial-direction through-hole 273, whereby a movement amount of the upper-end-portion supporting member 270 with respect to the base member 260 is limited.

The inward section 272 includes, on the inner circumference side, an O-ring 274 that seals a gap between the inward section 272 and the outer circumferential surface of the cylinder 230 to thereby keep the jack chamber 60 liquid tight.

The oil in the cylinder 230 is supplied to the jack chamber 60 via the annular channel 61 formed between the inner circumferential surface of the base member 260 and the outer circumferential surface of the cylinder 230.

(Configuration of the Channel Switching Unit 300)

The channel switching unit 300 changes an energization state to a coil 311 of the solenoid 310 to switch a channel of oil to a first switching state, a second switching state, and a third switching state during the compression stroke of the front fork 21. In the first switching state, the oil flows out from the first oil chamber 51, passes the discharge channel 41 through the channel switching unit 300, and flows into the reservoir chamber 40. In the second switching state, the oil flows out from the first oil chamber 51, passes the annular channel 61 through the channel switching unit 300 from the first oil chamber 51, and flows into the jack chamber 60. Further, in the third switching state, the oil flows out from the jack chamber 60, passes the discharge channel 41 through the channel switching unit 300, and flows into the reservoir chamber 40.

<Action of the Front Fork 21>

In the front fork 21 configured as explained above, the spring 500 supports the weight of the motorcycle 1 and absorbs a shock and the damping-force generating unit 130 attenuates vibration of the spring 500.

Figure 7:
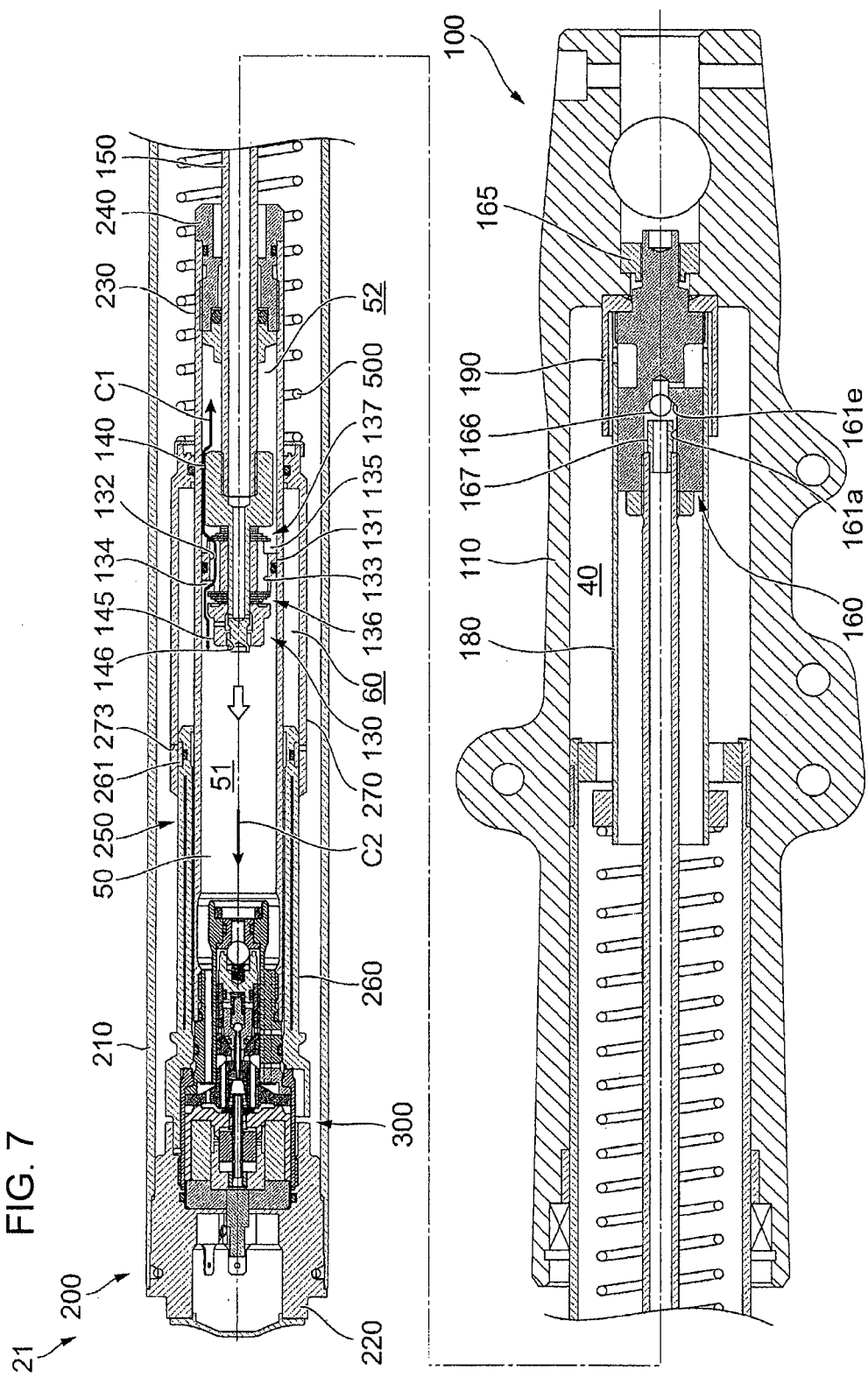
FIG. 7 is a diagram for explaining the action during a compression stroke of the front fork.

FIG. 7 is a diagram for explaining the action during the compression stroke of the front fork 21.

During the compression stroke of the front fork 21, the piston 131 of the damping-force generating unit 130 moves upward with respect to the cylinder 230 as indicated by a white arrow. The oil in the first oil chamber 51 is pushed by the movement of the piston 131 and pressure of the oil rises. As a result, the lower-end-side valve 137, which closes the first through-hole 132, opens. The oil flows into the second oil chamber 52 through the first through-hole 132 (see an arrow C1). A flow of the oil from the first oil chamber 51 to the second oil chamber 52 is narrowed by the first through-hole 132 and the lower-end-side valve 137 and obtains a damping force during the compression stroke.

When the rod 150 enters the inside of the cylinder 230 during the compression stroke, the oil equivalent to a rod entrance volume is supplied to the jack chamber 60 and the reservoir chamber 40 according to the switching state of the channel switching unit 300 (see an arrow C2). Note that the damping-force generating unit 130, the rod 150, the cylinder 230, and the like function as a pump that supplies the oil in the cylinder 230 to the jack chamber 60 or the reservoir chamber 40. In the following explanation, the pump is sometimes referred to as "pump P".

Figure 8:
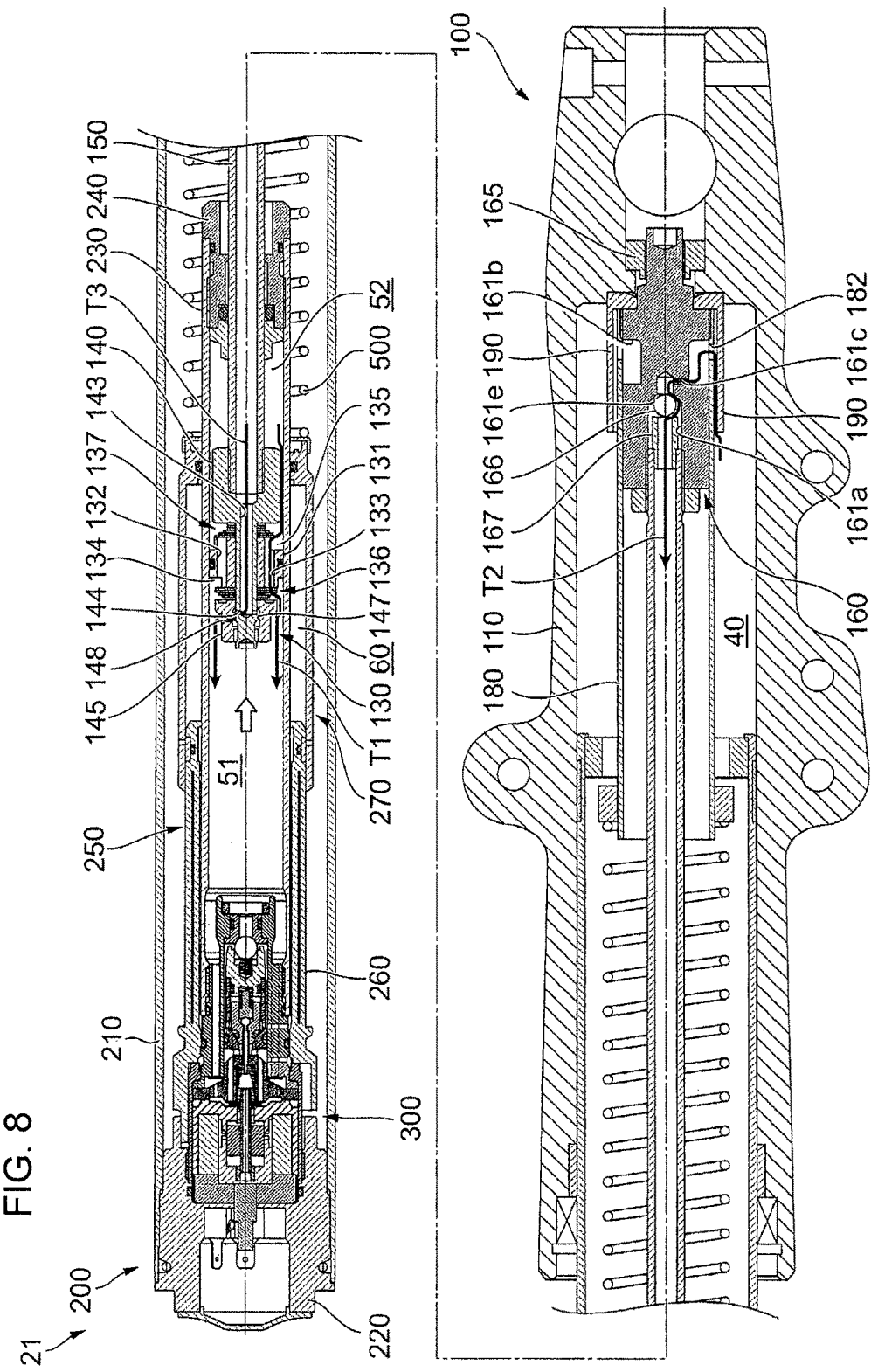
FIG. 8 is a diagram for explaining the action during an extension stroke of the front fork.

FIG. 8 is a diagram for explaining the action during the extension stroke of the front fork 21.

In the extension stroke of the front fork 21, the piston 131 of the damping-force generating unit 130 moves downward with respect to the cylinder 230 as indicated by a white arrow. The oil in the second oil chamber 52 is pushed by the movement of the piston 131 and the pressure of the oil rises. As a result, the upper-end-side valve 136, which closes the second through-hole 133, opens. The oil flows into the first oil chamber 51 through the second through-hole 133 (see an arrow T1). The flow of the oil from the second oil chamber 52 to the first oil chamber 51 is narrowed by the first through-hole 132 and the upper-end-side valve 136 and obtains a damping force during the extension stroke.

When the rod 150 exits from the inside of the cylinder 230 during the extension stroke, the oil equivalent to a rod exit volume is supplied from the reservoir chamber 40 to the first oil chamber 51. That is, the oil in the reservoir chamber 40 enters the first oil chamber 51 decompressed because the piston 131 moves downward. That is, the oil in the reservoir chamber 40 enters the axial-direction recess 161a of the rod holding member 160 through the communication hole 182 of the supporting-member holding member 180 and the radial-direction through-hole 161c of the rod holding member 160 and thereafter moves the ball 166 upward and enters the inside of the rod 150 (see an arrow T2). The oil entered the inside of the rod 150 reaches the first oil chamber 51 through the recess 143 of the piston bolt 140, the radial-direction through-hole 144, and the radial-direction through-hole 148 of the nut 145 (see an arrow T3).

In this way, the communication hole 182 of the supporting-member holding member 180, the radial-direction through-hole 161c of the rod holding member 160, the axial-direction recess 161a of the rod holding member 160, the inside of the rod 150, the recess 143 of the piston bolt 140, the radial-direction through-hole 144, and the radial-direction through-hole 148 of the nut 145 function as an intake path for sucking the oil from the reservoir chamber 40 into the cylinder 230 (the first oil chamber 51). The ball 166 and the inclined surface 161e formed in the axial-direction recess 161a of the rod holding member 160 function as a check valve that allows inflow of the oil from the reservoir chamber 40 into the inside of the rod 150 and suppresses discharge of the oil from the inside of the rod 150 to the reservoir chamber 40. In the following explanation, the ball 166 and the inclined surface 161e are referred to as "intake-side check valve Vc".

<Increase and Decrease of Vehicle Height>

In the front fork 21 acting as explained above, when the channel switching unit 300 is in the second switching state, during the compression stroke, the oil discharged from the pump P flows into the jack chamber 60 and an oil amount in the jack chamber 60 increases. The upper-end-portion supporting member 270 moves downward with respect to the base member 260 of the spring-length changing unit 250 according to the increase in the oil amount in the jack chamber 60. When the spring length of the spring 500 decreases according to the downward movement of the upper-end-portion supporting member 270 with respect to the base member 260, the spring force of the spring 500 pushing the upper-end-portion supporting member 270 increases compared with before the upper-end-portion supporting member 270 moves with respect to the base member 260. As a result, an initial set load for not changing relative positions of the vehicle body frame 11 and the front wheel 2 even if force acts from the vehicle body frame 11 to the front wheel 2 side is switched. In such a case, when the same force acts in the axial direction from the vehicle body frame 11 (the seat 19) side, a sinking amount of the front fork 21 decreases. Therefore, when the spring length of the spring 500 decreases according to the movement of the upper-end-portion supporting member 270 with respect to the base member 260, the height of the seat 19 increases (the vehicle height increases) compared with before the upper-end-portion supporting member 270 moves with respect to the base member 260.

On the other hand, when the channel switching unit 300 is in the third switching state, the upper-end-portion supporting member 270 moves upward with respect to the base member 260 of the spring-length changing unit 250 according to a decrease in the oil amount in the jack chamber 60. When the spring length of the spring 500 increases according to the upward movement of the upper-end-portion supporting member 270 with respect to the base member 260, the spring force of the spring 500 pushing the upper-end-portion supporting member 270 decreases compared with before the upper-end-portion supporting member 270 moves with respect to the base member 260. In such a case, the initial set load decreases and the sinking amount of the front fork 21 at the time when the same force acts from the vehicle body frame 11 (the seat 19) side in the axial direction increases. Therefore, when the spring length of the spring 500 increases according to the upward movement of the upper-end-portion supporting member 270 with respect to the base member 260, the height of the seat 19 decreases (the vehicle height decreases) compared with before the upper-end-portion supporting member 270 moves with respect to the base member 260.

Note that, when the channel switching unit 300 is in the first switching state, the oil discharged from the pump P during the compression stroke flows into the reservoir chamber 40. Therefore, the oil amount in the jack chamber 60 does not increase or decrease. Therefore, the height of the seat 19 is maintained (the vehicle height is maintained).

<Explanation of the Stroke Sensor System>

In the motorcycle 1 in this embodiment, a stroke amount of the rear suspension 22 is detected. An operation state of the rear suspension 22 can be grasped by detecting the stroke amount. Stroke speed obtained by differentiating the stroke amount can also be used. A stroke amount of the spring-length changing unit 250 in the front fork 21 is detected.

In this embodiment, the motorcycle 1 includes a stoke sensor system for detecting stroke amounts of the rear suspension 22 and the spring-length changing unit 250.

Figure 9:
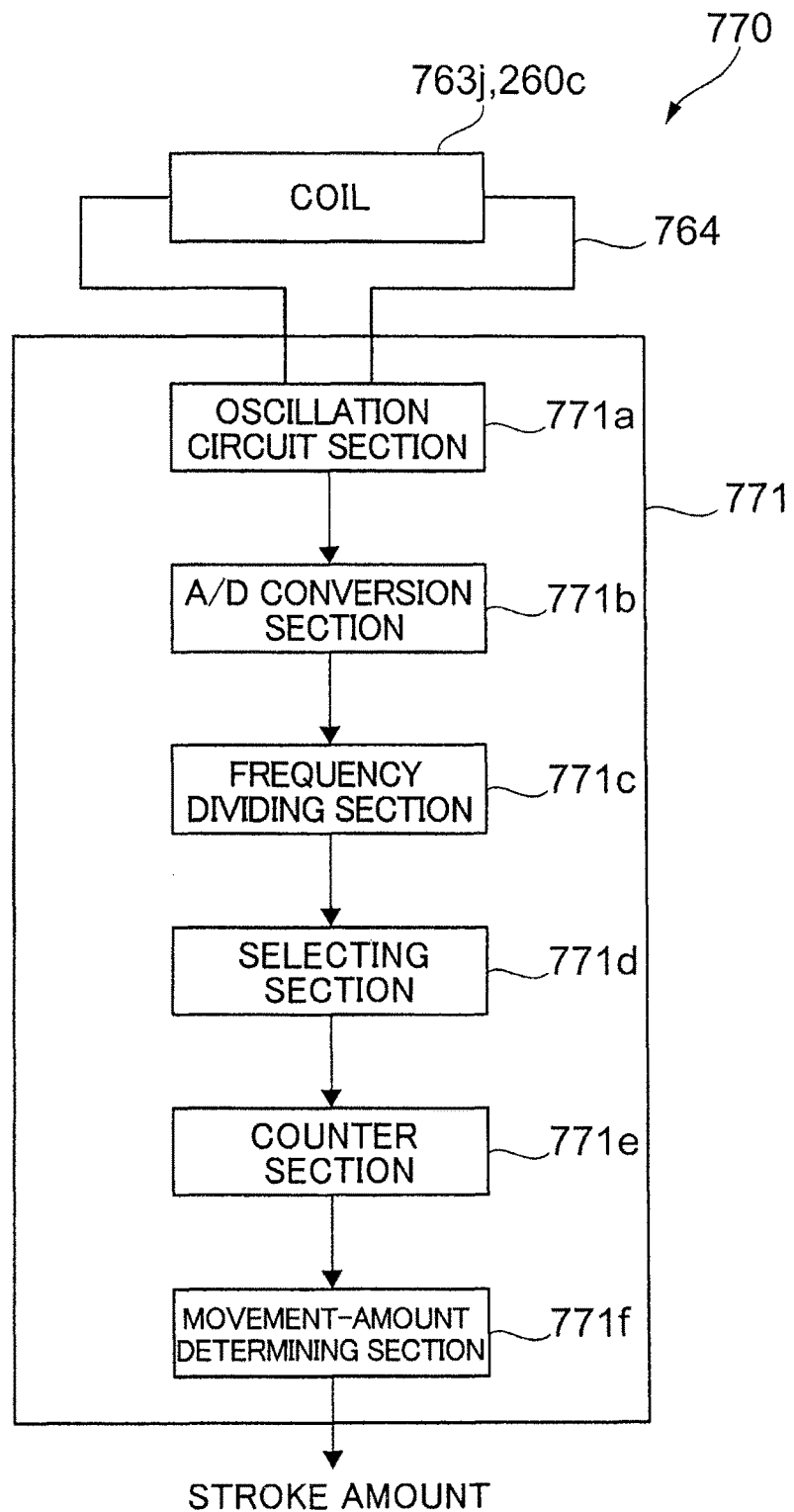
FIG. 9 is a block diagram for explaining the configuration of a stroke sensor system in the embodiment.

FIG. 9 is a block diagram for explaining the configuration of the stroke sensor system in this embodiment.

A stroke sensor system 770 shown in the figure includes the coil 763j (the coil 260c) and a movement-amount deriving section 771 that derives a movement amount at the time when the outer cylinder 712 (the upper-end-portion supporting member 270) and the guide 763c (the base member 260) relatively move.

The movement-amount deriving section 771 includes an oscillation circuit section 771a, an A/D conversion section 771b, a frequency dividing section 771c, a selecting section 771d, a counter section 771e, and a movement-amount determining section 771f. The movement-amount deriving section 771 is, for example, the control device 20 and is realized by an electronic control unit (ECU) or the like.

As explained in detail below, the oscillation circuit section 771a is electrically coupled to the coil 763j (the coil 260c) and includes a capacitor configuring an LC oscillation circuit. An alternating current having a predetermined resonance frequency is output from the LC oscillation circuit. In this embodiment, the resonance frequency changes according to the stroke amounts of the rear suspension 22 and the upper-end-portion supporting member 270.

Figure 10:
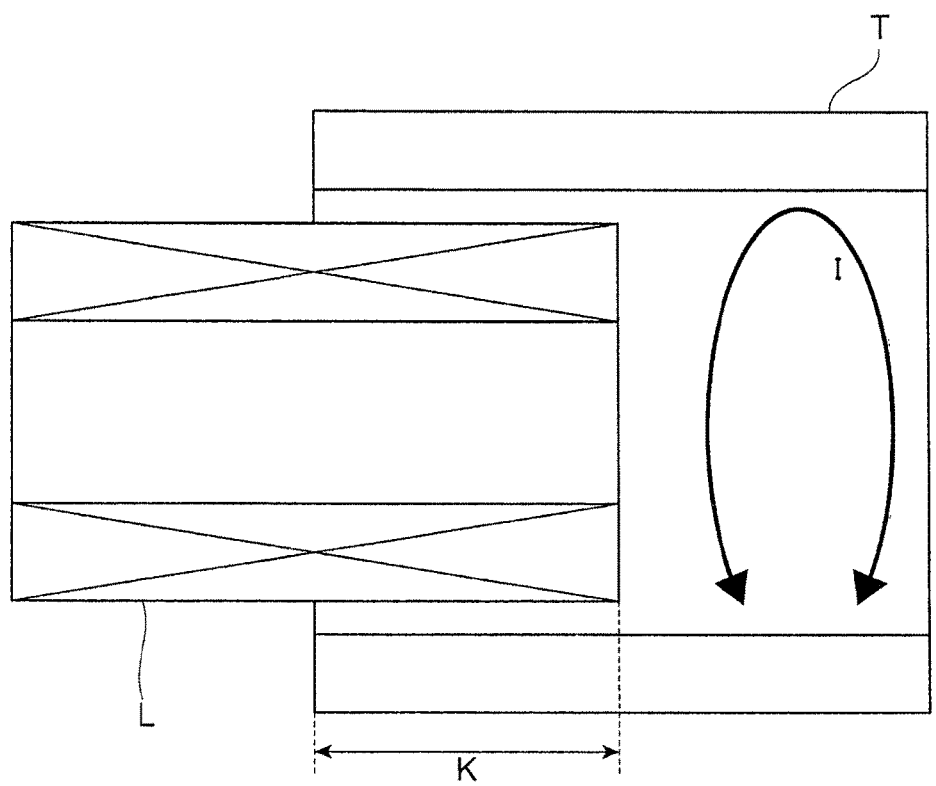
FIG. 10 is a diagram for explaining a relation between a stroke amount of the rear suspension or a spring-length changing unit and a resonance frequency in the embodiment.

FIG. 10 is a diagram for explaining a relation between a stroke amount of the rear suspension 22 or the spring-length changing unit 250 and a resonance frequency in this embodiment.

In an example shown in the figure, a cylindrical conductor T and a coil L fit with each other. A fitting length (an overlapping length) of the conductor T and the coil L is K. In this case, in the example explained above, the conductor T corresponds to the outer cylinder 712 (the upper-end-portion supporting member 270) made of aluminum. The coil L corresponds to the coil 763j (the coil 260c). The fitting length K corresponds to an overlapping length in the up-down direction of the outer cylinder 712 (the upper-end-portion supporting member 270) and the coil 763j (the coil 260c). Note that an inside/outside relation between the conductor T and the coil L and an inside/outside relation between the outer cylinder 712 and the coil 763j are in opposite relations as shown in FIG. 3 and FIG. 10. However, this difference does not affect the following explanation.

The fitting length K changes according to stroke amounts of the rear suspension 22 and the spring-length changing unit 250. When the rear suspension 22 and the spring-length changing unit 250 extend, the fitting length K decreases. When the rear suspension 22 and the spring-length changing unit 250 retract, the fitting length K increases.

When an alternating current is fed to the coil L, an eddy current I is generated in the conductor T to cancel fluctuation in a magnetic field. When the eddy current I is generated, a magnetic field formed around the coil L decreases according to the action of the eddy current I. That is, the inductance of the coil L is reduced in appearance by the eddy current I. When the fitting length K is small (the rear suspension 22 and the spring-length changing unit 250 extend), since the influence due to the eddy current I is small, the inductance increases. On the other hand, when the fitting length K is large (the rear suspension 22 and the spring-length changing unit 250 retract), since the influence of the eddy current I is large, the inductance decreases.

A resonance frequency of the LC oscillation circuit changes according to the inductance of the coil L. Specifically, a relation among a resonance frequency $f_0$, inductance L of a coil, and electric capacitance C of a capacitor is $f_0=1/(2\pi\sqrt{(LC)})$. That is, when the inductance of the coil L is large, the resonance frequency decreases. On the other hand, when the inductance of the coil L is small, the resonance frequency increases. Therefore, the stroke amounts of the rear suspension 22 and the spring-length changing unit 250 can be calculated from the resonance frequency.

The resonance frequency in this embodiment is, for example, 30 kHz (when the rear suspension 22 and the spring-length changing unit 250 have maximum lengths) to 60 kHz (when the rear suspension 22 and the spring-length changing unit 250 have minimum lengths). A maximum resonance frequency is set to approximately a double of a minimum resonance frequency.

Referring back to FIG. 9, the A/D conversion section 771b shapes an oscillation waveform output from the oscillation circuit section 771a into a shaped waveform of a digital signal converted from an analog signal. The A/D conversion section 771b is a comparator that converts an analog signal into a digital signal of 1 bit.

The frequency dividing section 771c divides the digital signal converted by the A/D conversion section 771b into a frequency-divided waveform.

FIG. 11A is a diagram showing an oscillation waveform output from the oscillation circuit section 771a. FIG. 11B is a diagram showing a shaped waveform shaped by the A/D conversion section 771b. FIG. 11C is a diagram showing a frequency-divided waveform divided by the frequency dividing section 771c.

As shown in FIG. 11B, the shaped waveform has a frequency same as the frequency of the oscillation waveform. However, the shaped waveform is shaped from a sine wave into a rectangular wave. As shown in FIG. 11C, the frequency-divided waveform remains in the waveform of a rectangular wave. However, the frequency of the frequency-divided waveform is reduced by the frequency division.

For example, the frequency dividing section 771c performs frequency division at four frequency division ratios and outputs frequency-divided waveforms. The frequency division ratios are, for example, $2^n$ (n is an integer) and are selected out of 1 to 4096. In this embodiment, as the frequency division ratios, 32 ($=2^5$), 64 ($=2^6$), 128 ($=2^7$), and 256 ($=2^8$) are selected.

As the A/D conversion section 771b and the frequency dividing section 771c, for example, a binary counter can be used.

The selecting section 771d selects one of the frequency-divided waveforms output from the frequency dividing section 771c.

Since the selecting section 771d selects the frequency-divided waveform, even when fluctuation in the frequency of the oscillation waveform output from the oscillation circuit section 771a is large and a dynamic range is wide, it is possible to keep the frequency of the frequency-divided waveform within a relatively narrow range.

Further, responsiveness of the stroke sensor becomes less likely to change. That is, when the frequency is larger, the number of times the counter section 771e performs measurement of a cycle increases. When the frequency is smaller, the number of times the counter section 771e explained below performs measurement of a cycle decreases. Therefore, the number of times of output of stroke amounts by the movement-amount determining section 771f explained below increases or decreases. As a result, the responsiveness of the stroke sensor changes. If the selecting section 771d selects the frequency-divided waveform, this change can be reduced. Actually, a threshold decided in advance concerning the cycle of the frequency-divided waveform is provided. The selecting section 771d selects the frequency-divided waveform on the basis of the threshold.

In practice, it is preferable that the frequency of the frequency-divided waveform fits in a range of approximately 300 Hz to 2000 Hz.

As the selecting section 771d, for example, a multiplexer can be used.

The counter section 771e counts, with a counter including a quartz oscillator, an edge interval of the frequency-divided waveform selected by the selecting section 771d and measures a cycle. The edge interval can be set to, for example, an interval of one cycle of a frequency-divided waveform indicated by E1 in FIG. 11C. However, the edge interval is not limited to this and may be, for example, an interval of a half cycle of the frequency-divided waveform as indicated by E2.

The movement-amount determining section 771f determines the stroke amount of the rear suspension 22 and the spring-length changing unit 250 from a count value by the counter section 771e. The stroke amounts can be calculated by, for example, preparing a predetermined calculation formula and inputting the count value to the calculation formula. The stroke amounts can be determined by substituting the count value in a map indicating correspondence between the count value and the stroke amounts.

However, when a conventional LC oscillation circuit is used as the LC oscillation circuit used in the oscillation circuit section 771a, the LC oscillation circuit is easily affected by noise.

Figure 12:
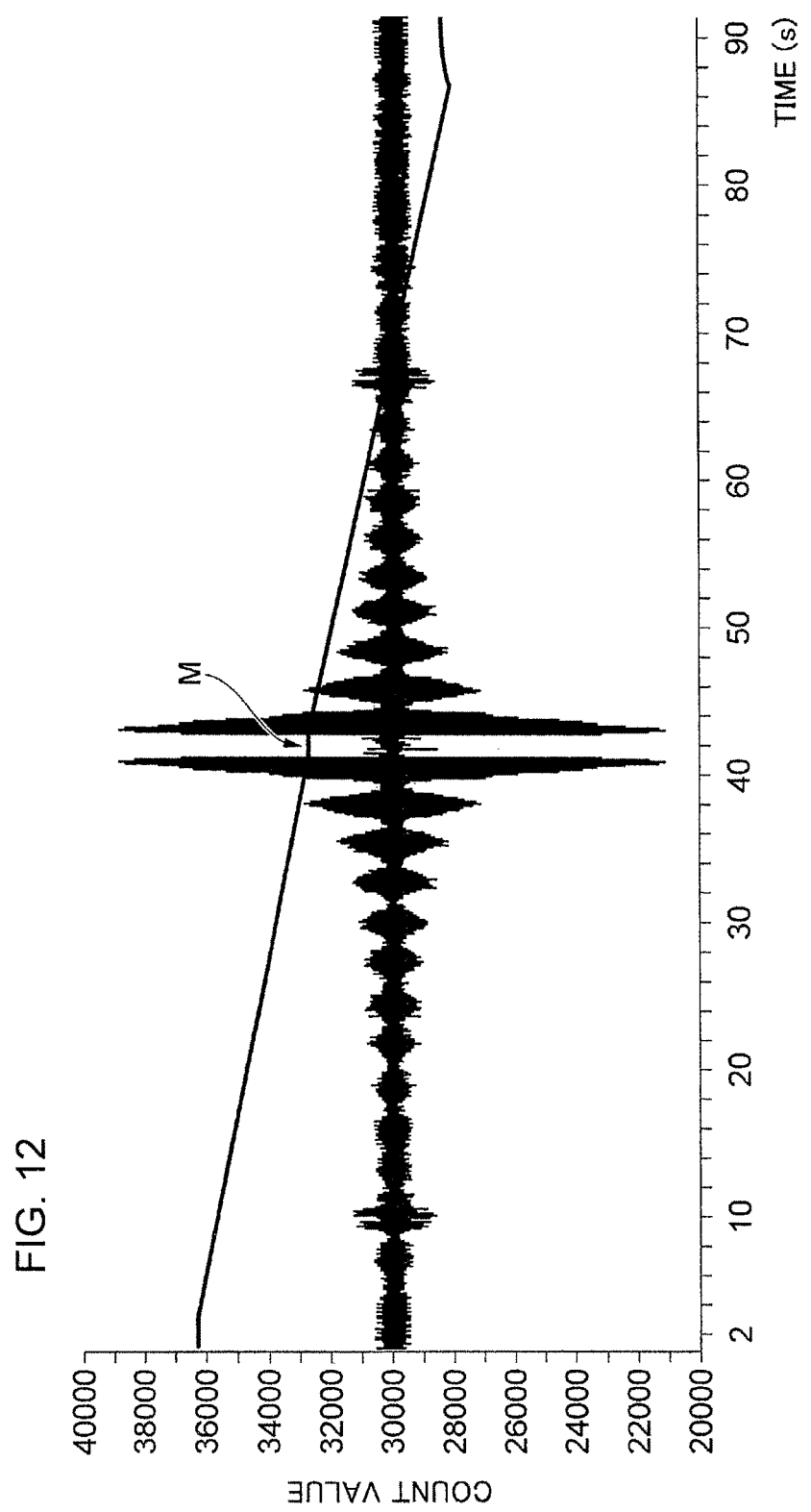
FIG. 12 is a diagram for explaining the influence of noise that occurs when a conventional LC oscillation circuit is used.

FIG. 12 is a diagram for explaining the influence of noise that occurs when the conventional LC oscillation circuit is used.

In FIG. 12, a count value output from the counter section 771e when the rear suspension 22 is extended at fixed speed from a retracted state. The abscissa represents time and the ordinate represents a count value counted by the counter section 771e. Note that, as the LC oscillation circuit, an existing Franklin oscillator is used. Note that the influence of noise in the case of the rear suspension 22 is explained below. However, the same applies to the front fork 21.

In the figure, a solid line represents a change in the count value with respect to time. As shown in the figure, the count value decreases according to the elapse of time. In the figure, noise detected at the time is also shown. That is, a change in noise with respect to the time is also shown. Although not indicated by the solid line, the counter value decreases while fluctuating up and down. This fluctuation is caused by noise. Therefore, the noise can be represented as a fluctuation amount. In this case, as shown in the figure, the noise draws a jitter peak having regularity and alternately repeats high and low as time elapses.

The noise shown in the figure is caused by a pulse width modulation (PWM) signal used in driving a motor and a solenoid. A signal line for feeding the PWM signal is bound together with the signal line 764 to form a harness. Therefore, noise intrudes from the signal line 764. The noise is usually in-phase noise.

The count value decreases according to the elapse of time. However, as indicated by M, the count value is fixed around approximately 32000. That is, a phenomenon occurs in which the count value stays at a fixed value. This is considered to be because, in this region, noise is particularly large as shown in the figure and is more predominant than a frequency-divided waveform.

This is approximately 80 Hz when converted into an oscillation frequency. This frequency is four times as large as a frequency (20 kHz) of a PWM signal. Therefore, the noise is considered to be a quadruple harmonic of the PWM signal. That is, the conventional LC oscillation circuit is susceptible to the frequency of the PWM signal or a domain of the frequency of the harmonic of the PWM signal.

If the noise is noise that occurs from the inside of a substrate mounted with the oscillation circuit section 771a, it is possible to cope with the noise through rationalization of a circuit configuration and a circuit pattern. It is difficult to take measures against noise that intrudes from the signal line 764 between the coil 763j and the oscillation circuit section 771a. If a sufficient distance is secured between the signal line 764 and the wire of the PWM signal, the intrusion of the noise decreases. However, usually, the signal line 764 and the wire are bound together as a harness. When the signal line 764 and the wire are separated, a degree of freedom of design of a vehicle body decreases and a commercial value is sometimes deteriorated.

If a shield line is used as the signal line 764, the intrusion of the noise can be prevented to some extent. However, an effect involved in a cost increase due to shield line introduction is not obtained. Further, there is also a method of using a low-pass filter. However, the resolution of the stroke sensor system decreases and the performance of the stroke sensor system is substantially reduced.

In the conventional general LC oscillation circuit, both electrodes of the coil L are unbalanced (asymmetry) and have an impedance difference.

Figure 13A:
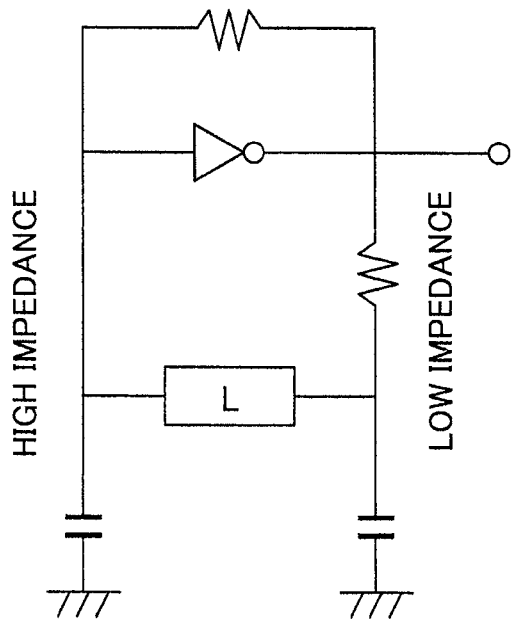
FIGS. 13A and 13B are diagrams showing impedance differences in the conventional LC oscillation circuit.
Figure 13B:
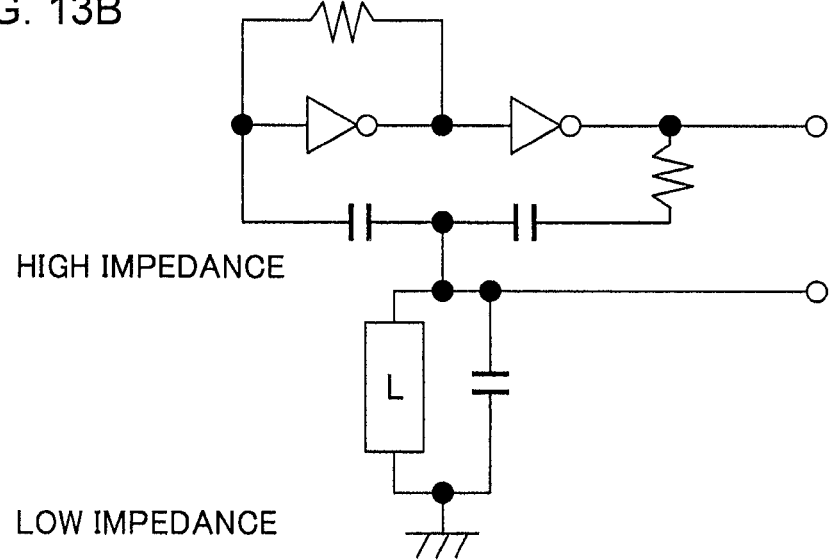

FIGS. 13A and 13B are diagrams showing impedance differences concerning the conventional LC oscillation circuit.

FIG. 13A shows a Colpitts oscillator of a type in which an inverter is used. FIG. 13B shows a Franklin oscillator of a type in which an inverter is used. In both of the oscillators, both the electrodes of the coil L are a high-impedance side and a low-impedance side. When there is an impedance difference between both the electrodes of the coil L, noise does not equally acts on both the electrodes of the coil L. The circuit configuration is easily affected by the noise.

Therefore, in this embodiment, the LC oscillation circuit is configured as a balanced circuit to improve noise resistance.

FIGS. 14A and 14B are diagrams showing examples of LC oscillation circuits used in this embodiment.

The LC oscillation circuit shown in FIG. 14A includes an even number of capacitors C1 and C2 electrically coupled to the coil L and configuring an LC resonance section and comparators H1 and H2, which are an example of an even number of exciting sections for exciting an oscillation waveform output by the LC resonance section by relative movement between the outer cylinder 712 and the guide 763c. The capacitors C1 and C2 have the same electric capacitance. The comparator H1 and the comparator H2 are the same. The even number of capacitors C1 and C2 and the even number of comparators H1 and H2 are divided into equal numbers (in this case, one) to configure a balanced circuit. In this case, both the electrodes of the coil L are electrically equal. Impedances at both the electrodes of the coil L are the same. As a result, noise equally acts on both the electrodes of the coil L, and the circuit configuration which is less likely to be affected by the noise can be provided.

In the LC oscillation circuit, the comparators H1 and H2 are used to output an oscillation waveform by differential comparison of potentials on both sides of the coil L. By configuring such a differential circuit, when noise is in-phase noise, it is possible to cancel the noise. That is, resistance against the in-phase noise is improved.

The LC oscillation circuit shown in FIG. 14B includes an even number of capacitors C1 and C2 and inverters N1 and N2, which are an example of an even number of exciting sections. The capacitors C1 and C2 have the same electric capacitance. The inverters N1 and the inverter N2 are the same. The even number of capacitors C1 and C2 and the even number of inverters N1 and N2 are divided into equal numbers (in this case, one) to configure a balanced circuit. Note that, in the LC oscillation circuit, an output by differential comparison is not performed.

These LC oscillation circuits further include a wire S1 that couples the capacitor C1 and the capacitor C2 in series. The wire S1 is grounded. This can be paraphrased as "a middle point of capacitors divided into equal numbers is grounded". Note that the wire S1 may be coupled to a low-impedance line on a power supply+side without being grounded.

Further, these LC oscillation circuit includes a bypass capacitor C3 at the wire S1. In the examples shown in the figures, the lower side in the figure of the bypass capacitor C3 is set as the ground side and the upper side in the figure is set as the power supply side. Note that, when the wire S1 is desired to be coupled to a low-impedance line on the power supply+side without being grounded, the upper side in the figure is set as the ground side. By providing the bypass capacitor C3, it is possible to perform filtering to allow noise to escape to the ground side and not to be transmitted to the exciting section.

These LC oscillation circuits further include Zener diodes D1 and D2 coupled in parallel to the capacitors C1 and C2. In this case, an anode side of the Zener diodes D1 and D2 are set as the ground side. By providing the Zener diodes D1 and D2, when static electricity and electromagnetic noise intrude, it is possible to allow the static electricity and the electromagnetic noise to escape to the ground side. Resistance against the static electricity and the electromagnetic noise is improved.

Figure 16:
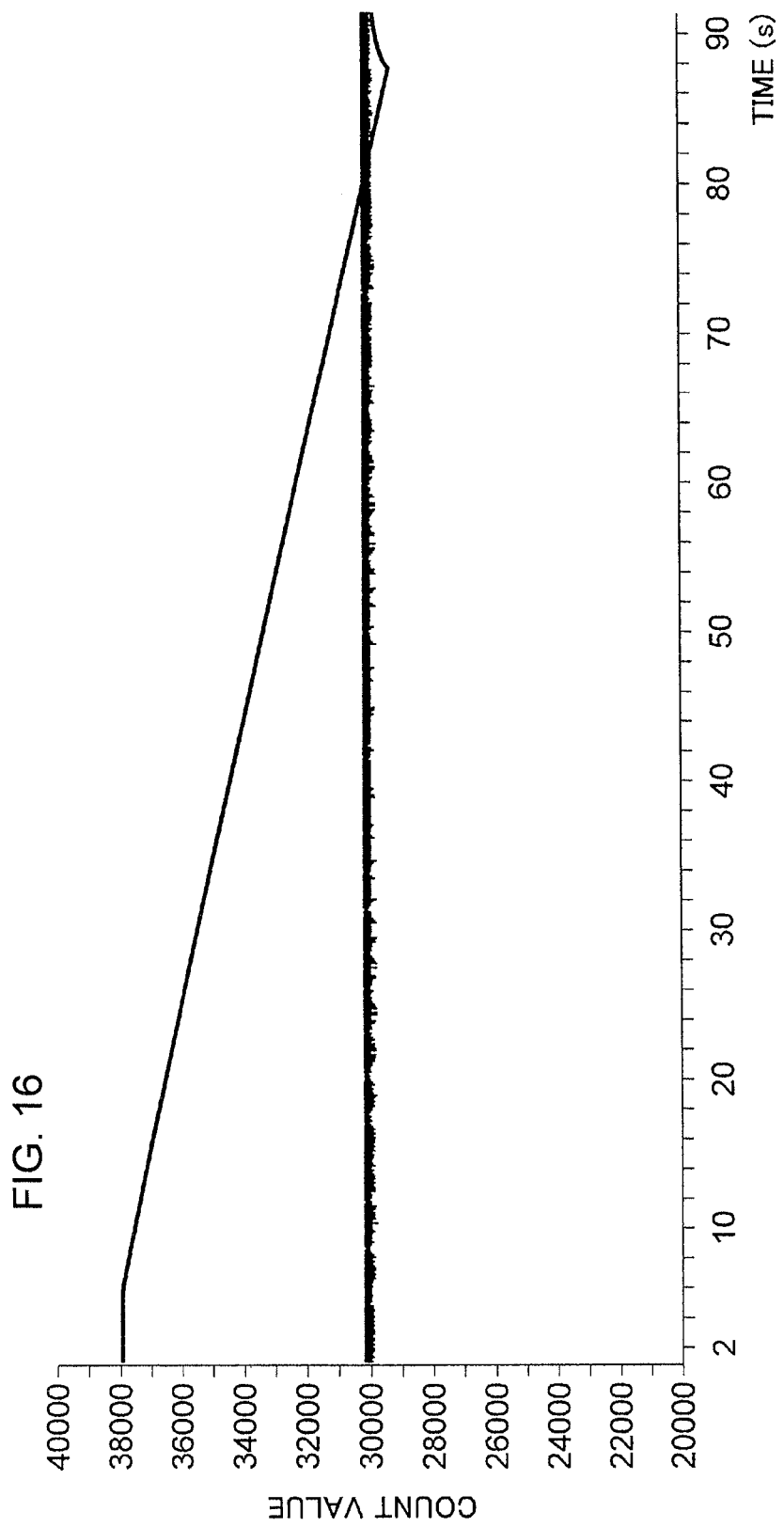
FIG. 16 is a diagram for explaining the influence of noise that occurs when the LC oscillation circuit in the embodiment is used.

FIGS. 15 and 16 are diagrams for explaining the influence of noise that occurs when the LC oscillation circuit in this embodiment is used. FIG. 15 shows the influence of noise that occurs when the LC oscillation circuit shown in FIG. 14A is used. FIG. 16 shows the influence of noise that occurs when the LC oscillation circuit shown in FIG. 14B is used.

FIGS. 15 and 16 show count values output from the counter section 771e when the rear suspension 22 is extended at fixed speed from a retracted state as in the case of FIG. 12. The abscissa represents time and the ordinate represents a count value counted by the counter section 771e.

A solid line represents a change in the count value with respect to time. Noise detected at the time is also shown.

As shown in FIGS. 15 and 16, the count value decreases according to the elapse of time. The phenomenon in which the counter value is fixed halfway shown in FIG. 12 does not occur. It is seen that noise hardly occurs.

The noise is not limited to noise caused by the PWM signal.

Figure 17A:
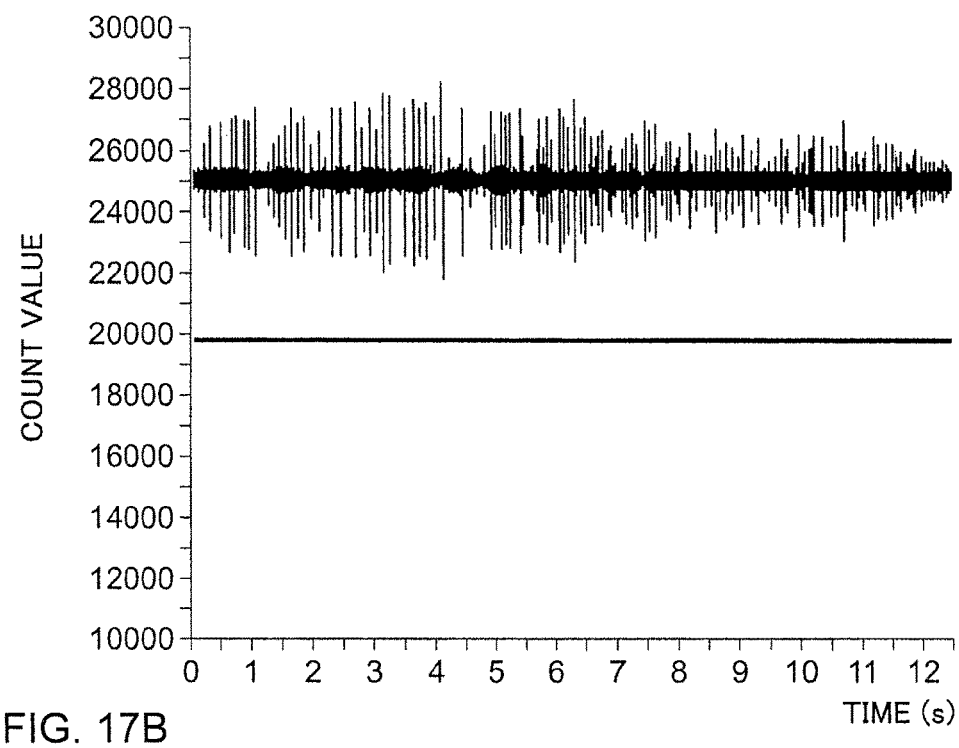
FIGS. 17A and 17B are diagrams showing the influence on ignition noise of an engine.
Figure 17B:
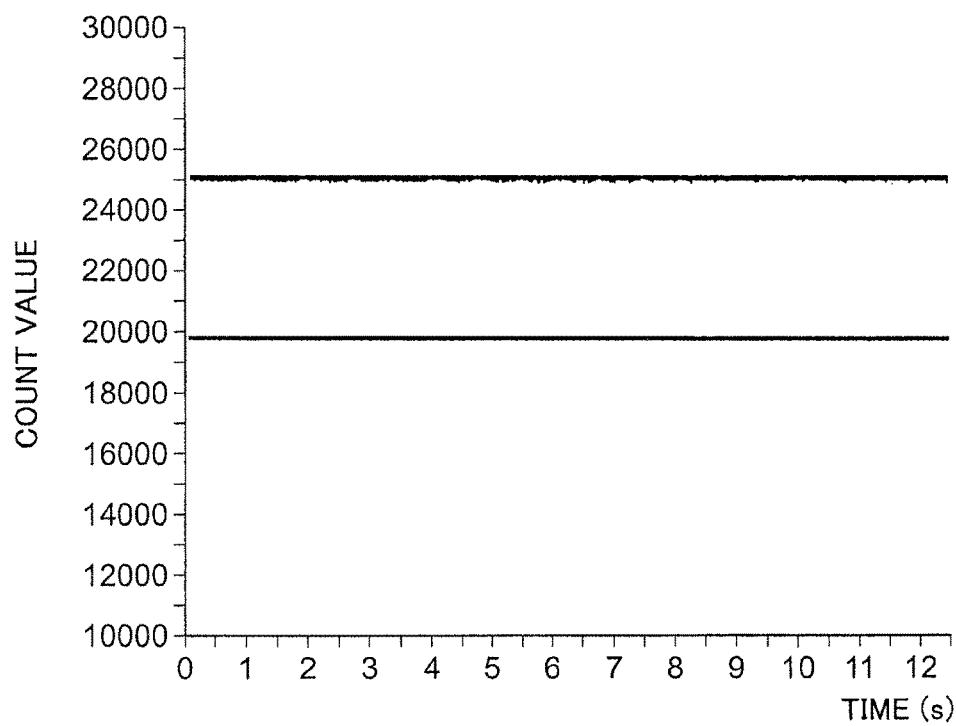

FIGS. 17A and 17B are diagrams showing the influence on ignition noise of the engine 13.

In the figures, a situation is set in which the signal line 764 is wound three times on a high-tension cord for supplying an ignition current of a high voltage to an ignition plug of the engine 13 to allow ignition noise to easily intrude into the signal line 764. Noise detected in the conventional LC oscillation circuit and noise detected in the LC oscillation circuit in this embodiment are compared.

FIG. 17A is a diagram for explaining the influence of ignition noise that occurs when the conventional LC oscillation circuit is used. FIG. 17B is a diagram for explaining the influence of ignition noise that occurs when the LC oscillation circuit in this embodiment is used.

As shown in FIG. 17A, the conventional LC oscillation circuit is affected by the ignition noise. A lot of noise occurs in the LC oscillation circuit. On the other hand, the LC oscillation circuit in this embodiment is hardly affected by the ignition noise. Little noise occurs in the LC oscillation circuit.

The LC oscillation circuit explained above is applied to the stroke sensor system 770. However, not only this, but the LC oscillation circuit can also be applied to other systems such as a tuning circuit and a signal transmission circuit.

EXPLANATION OF REFERENCE NUMERALS

21 Front fork
22 Rear suspension
260c, 763j Coils
250 Spring-length changing unit
712 Outer cylinder 763c Guide
764 Signal line
770 Stroke sensor system
771 Movement-amount deriving section
771a Oscillation circuit section
771b A/D conversion section
771c Frequency dividing section
771d Selecting section
771e Counter section
771f Movement-amount determining section
C1, C2 Capacitors
H1, H2 Comparators
N1, N2 Inverters
S1 Wire

What is claimed is:

1. A stroke sensor system comprising:
a vehicle-body-side member formed in a tubular shape and located at a vehicle body side;
a wheel-side member formed in a tubular shape, located at a wheel side, coupled to the vehicle-body-side member, and configured to move relative to the vehicle-body-side member in an axial direction of the vehicle-body-side member; and
a movement-amount deriving section configured to derive an axial movement amount of relative movement between the vehicle-body-side member and the wheel-side member, wherein
at least a part of one of the vehicle-body-side member and the wheel-side member is an electric conductor, and other of the vehicle-body-side member and the wheel-side member is provided with a coil,
the movement-amount deriving section comprises:
an even number of capacitors electrically coupled to the coil and configuring an LC resonance section; and
an even number of exciting sections for exciting an oscillation waveform output by the LC resonance section by the relative movement between the vehicle-body-side member and the wheel-side member,
the even number of capacitors and the even number of exciting sections are divided into a plurality of groups of same number of the capacitor and a plurality of groups of same number of the exciting section respectively to configure a balanced circuit,
the movement-amount deriving section derives the axial movement amount based on the oscillation waveform,
the electric conductor and the coil move relative to each other by the relative movement between the vehicle-body-side member and the wheel-side member, whereby the axial movement amount is calculated from a resonance frequency of the LC resonance section, which varies according to a change in an inductance of the coil due to the movement of the electric conductor relative to the coil, and
the change in the inductance of the coil corresponds to a change in an overlapping length of the electric conductor and the coil.

2. The stroke sensor system according to claim 1, further comprising a wire that couples in series the capacitors divided into the plurality of groups of same number of the capacitor, wherein
the wire is grounded.

3. The stroke sensor system according to claim 1, wherein the exciting sections output the oscillation waveform by differential comparison of potentials on both sides of the coil.

4. The stroke sensor system according to claim 2, wherein the exciting sections output the oscillation waveform by differential comparison of potentials on both sides of the coil.

5. The stroke sensor system according to claim 1, further comprising a wire that couples the capacitors divided into the plurality of groups of same number of the capacitor, and a bypass capacitor that is provided at the wire.

6. The stroke sensor system according to claim 2, further comprising a bypass capacitor that is provided at the wire.

7. The stroke sensor system according to claim 3, further comprising a wire that couples the capacitors divided into the plurality of groups of same number of the capacitor, and a bypass capacitor that is provided at the wire.

8. The stroke sensor system according to claim 4, further comprising a bypass capacitor that is provided at the wire.

9. The stroke sensor system according to claim 1, further comprising Zener diodes coupled in parallel to the capacitors divided into equal numbers.

10. The stroke sensor system according to claim 2, further comprising Zener diodes coupled in parallel to the capacitors divided into equal numbers.

11. The stroke sensor system according to claim 3, further comprising Zener diodes coupled in parallel to the capacitors divided into equal numbers.

12. The stroke sensor system according to claim 4, further comprising Zener diodes coupled in parallel to the capacitors divided into equal numbers.

13. The stroke sensor system according to claim 5, further comprising Zener diodes coupled in parallel to the capacitors divided into equal numbers.

14. The stroke sensor system according to claim 6, further comprising Zener diodes coupled in parallel to the capacitors divided into equal numbers.

15. The stroke sensor system according to claim 7, further comprising Zener diodes coupled in parallel to the capacitors divided into equal numbers.

16. The stroke sensor system according to claim 8, further comprising Zener diodes coupled in parallel to the capacitors divided into equal numbers.

* * * * *